(12) United States Patent
Suzuki et al.

(10) Patent No.: US 6,707,298 B2
(45) Date of Patent: Mar. 16, 2004

(54) MAGNETIC SENSOR

(75) Inventors: Toshihisa Suzuki, Hamamatsu (JP);
Hideki Sato, Toyooka-mura (JP);
Makoto Kaneko, Hamakita (JP)

(73) Assignee: Yamaha Corporation (JP)

( * ) Notice: Subject to any disclaimer, the term of this patent is extended or adjusted under 35 U.S.C. 154(b) by 0 days.

(21) Appl. No.: 10/281,178

(22) Filed: Oct. 28, 2002

(65) Prior Publication Data

US 2003/0094944 A1 May 22, 2003

(30) Foreign Application Priority Data

| Oct. 29, 2001 | (JP) | ..................... | 2001-330681 |
| Jun. 4, 2002 | (JP) | ..................... | 2002-163310 |

(51) Int. Cl.[7] ............................................. G01R 33/02
(52) U.S. Cl. ...................................... 324/252; 324/260
(58) Field of Search ........................... 324/249, 252, 324/235, 239, 207.21, 260, 238, 262; 360/324, 200, 206; 338/32 R, 32 M

(56) References Cited

U.S. PATENT DOCUMENTS

| 5,119,025 A | * | 6/1992 | Smith et al. | ............... | 324/252 |
| 5,260,653 A | * | 11/1993 | Smith et al. | ............... | 324/252 |
| 5,583,474 A | | 12/1996 | Mizoguchi et al. | | |
| 5,668,686 A | * | 9/1997 | Shouji et al. | ............... | 360/113 |

FOREIGN PATENT DOCUMENTS

| JP | 7-230611 | 8/1995 |
| JP | 7-307503 | 11/1995 |
| JP | 11-109006 | 4/1999 |
| JP | 2002-252393 | 9/2002 |

* cited by examiner

Primary Examiner—N. Le
Assistant Examiner—Subhash Zaveri
(74) Attorney, Agent, or Firm—Dickstein, Shapiro, Morin & Oshinsky, LLP.

(57) ABSTRACT

A magnetic sensor comprises a thin-film-like magnetic tunnel effect element (magnetoresistive effect element) 11. A coil 21 is disposed in a plane under the magnetic tunnel effect element 11 and parallel to a thin-planar film surface of the element. The coil 21 is a double spiral type coil which includes a first spiral conductor portion 21-1 and a second spiral conductor portion 21-2. The magnetic tunnel effect element 11 is disposed between a spiral center P1 of the first conductor portion 21-1 and a spiral center P2 of the second conductor portion 21-2 in a plan view. The first and second conductor portions 21-1 and 21-2 are connected such that electric currents in the same direction pass through a part of the first conductor portion 21-1 that overlaps the magnetic tunnel effect element 11 in a plan view and through a part of the second conductor portion 21-2 that overlaps the magnetic tunnel effect element 11 in a plan view.

10 Claims, 30 Drawing Sheets

External Magnetic Field To Be Detected  h(Oe)

CASE WHERE ALL IS NORMAL

INSUFFICIENT SENSITIVITY IN X AXIS MAGNETIC SENSOR

X Axis Magnetic Sensor Selected

X1-X3＜C1

|X2-X4|＜C2

(A)

Y Axis Magnetic Sensor Selected

Y3-Y1≧C1

|Y2-Y4|＜C2

(B)

INSUFFICIENT SENSITIVITY IN Y AXIS MAGNETIC SENSOR (A) X Axis Magnetic Sensor Selected
$X1-X3 \geqq C1$
$|X2-X4| < C2$ (B) Y Axis Magnetic Sensor Selected
$Y3-Y1 < C1$
$|Y2-Y4| < C2$

DETECTION OBJECT IS FIXED TO Y AXIS MAGNETIC SENSOR
(Sensor Unswitchable)

X Axis Magnetic Sensor Selected

X1-X3 < C1

|X2-X4| < C2

(A)

Y Axis Magnetic Sensor Selected

Y3-Y1 ≧ C1

|Y2-Y4| < C2

(B)

MAGNETIC SENSOR

BACKGROUND OF THE INVENTION

1. Field of the Invention

The present invention relates to a magnetic sensor comprising a magnetoresistive effect element and a coil for generating a magnetic field which is applied to the magnetoresistive effect element.

2. Description of the Related Art

Magnetic sensors have hitherto been known which employ as a magnetic field detection element a magnetoresistive effect element such as a giant magnetoresistive effect element (GMR element) or a magnetic tunnel effect element (TMR element). As shown in FIG. 33, such a magnetic sensor may comprise a coil 110 for applying a bias magnetic field to a magnetoresistive effect element 100. In this case, the coil 110 is formed spirally, and the magnetoresistive effect element 100 is formed above the spiral of the coil 110, and between the center of the spiral and the outermost circumferential part in a plan view. The bias magnetic field applied to the magnetoresistive effect element 100 is generated by electric current flowing through windings of the coil 110 positioned immediately below the magnetoresistive effect element 100.

However, according to the above prior art, the coil 110 includes large part that does not contribute directly to the forming of the bias magnetic field, which results in the large occupancy area of the coil 110 in the sensor, posing a problem that the coil 110 will be an obstacle to the miniaturization of the magnetic sensor. Another problem is that because the overall length of the coil 110 is increased with its increased resistance, the power consumption for generating the bias magnetic field will increase, or that because the electric current that might be necessary with a limited power supply voltage can not be secured, it will be difficult to form a desired bias magnetic field.

SUMMARY OF THE INVENTION

The present invention was conceived in order to address the above problems. According to a first aspect of the present invention there is provided a magnetic sensor comprising a thin-film-like magnetoresistive effect element; and a coil formed in a plane parallel to a planar film surface of the magnetoresistive effect element, the coil generating magnetic fields applied to the magnetoresistive effect element; wherein the coil comprises a first conductor forming a spiral in a plan view, and a second conductor forming a spiral in a plan view; wherein the magnetoresistive effect element is disposed between a spiral center of the first conductor and a spiral center of the second conductor in a plan view; and wherein the first conductor and the second conductor are connected such that electric currents in substantially the same direction pass through a part of the first conductor at a portion overlapping the magnetoresistive effect element in a plan view and through a part of the second conductor at a portion overlapping the magnetoresistive effect element in a plan view. The above magnetoresistive effect element can include a giant magnetoresistive effect element, a magnetic tunnel affect element, etc.

Thus, the magnetoresistive effect element is disposed between the spiral center of the first conductor that is spiral In a plan view and the spiral center of the second conductor that is spiral in a plan view, and an electric current in substantially the same direction passes through a portion of the first conductor at a portion to overlap the magnetoresistive effect element in a plan view and a portion of the second conductor at a portion to overlap the magnetoresistive effect element in a plan view. As a result, since large part of the conductor forming the coil can be used for generating the magnetic field applied to the magnetoresistive effect element, the occupancy area of the coil in the sensor can be reduced.

In this case, preferably, the part of the first conductor at the portion overlapping the magnetoresistive effect element in a plan view and the part of the second conductor at the portion overlapping the magnetoresistive effect element in a plan view are formed rectilinearly parallel to each other.

Thus, since an electric current flows in parallel with each of the conductors passing immediately under the magnetoresistive effect element (at a portion to overlap the magnetoresistive effect element in a plan view), each magnetic field generated by the electric current flowing in each conductor does not offset each other. Therefore, the magnetic field applied to the magnetoresistive effect element can be generated efficiently (without wasting the electric power).

Preferably, widths of the first and second conductors at the portion overlapping the magnetoresistive effect element in a plan view are equal, the widths being different from widths of the first and second conductors at the remaining portions.

Thus, the resistance value of the entire coil can be reduced, while an electric current of the magnitude necessary for generating a magnetic field of a predetermined magnitude is being applied to each conductor passing immediately under the magnetoresistive effect element, thereby making it possible to lower the power consumption.

In such a magnetic sensor, the coil can be used as a coil for generating a magnetic field to confirm whether or not the magnetoresistive effect element functions normally. In the case where the magnetoresistive effect element is a magnetoresistive effect element (e.g., a giant magnetoresistive effect element) including a free layer and a pin layer, the coil can be used as a coil to generate a magnetic field for initializing the direction of magnetization of the free layer. Further, in the case where the magnetoresistive effect element is a magnetic tunnel effect element, the coil can be used as a coil to generate a bias magnetic field for the magnetic tunnel effect element to detect the magnetic field applied to the element.

According to a second aspect of the present invention there is provided a magnetic sensor comprising a substrate; a first magnetic detection portion (unit) formed on the substrate, the first magnetic detection portion indicating a physical quantity which increases (which becomes larger) as the magnitude of a magnetic field in a first direction in a first orientation increases, the first magnetic detection portion indicating the physical quantity which decreases (which becomes smaller) as the magnitude of a magnetic field in the opposite direction to the first direction in the first orientation increases; a second magnetic detection portion formed on the substrate, the second magnetic detection portion indicating a physical quantity which increases (which becomes larger) as the magnitude of a magnetic field in a second direction in a second orientation that crosses (e.g., at right angles) the first orientation increases, the second magnetic detection portion indicating the physical quantity which decreases (which becomes smaller) as the magnitude of a magnetic field in the opposite direction to the second direction in the second orientation increases; a first testing coil disposed in the vicinity of the first magnetic detection portion (e.g., burled under the first magnetic detection portion within the substrate), for generating a magnetic field whose magnitude and direction change in the first orientation depending on electric current flowing therethrough, the first testing coil applying the generated magnetic field to the first magnetic detection portion; a second testing coil disposed in the vicinity of the second magnetic detection portion or buried under the second magnetic detection portion within the substrate, for generating a magnetic field whose magnitude and direction change in the second orientation depending on electric current flowing therethrough, the second testing coil applying the generated magnetic field to the second magnetic detection portion; an electric current supply source; a connection conductor for connecting the first testing coil and the second testing coil in series to the electric current supply source: and a conduction control circuit interposed in a closed circuit which comprises the electric current supply source, the first testing coil, the second testing coil and the connection conductor, for switching the states of the first testing coil and of the second testing coil into either a conductive state in which electric current from the electric current supply source flows therethrough or an unconductive state in which the electric current is shut off.

This magnetic sensor comprises at least two magnetic detection portions on the substrate. These magnetic detection portions may be the magnetoresistive effect element itself, or may be those that are formed by connecting a plurality of magnetoresistive effect elements, for example, in the form of a bridge circuit. The first magnetic detection portion, which is one of these magnetic detection portions, indicates a physical quantity which becomes larger as the magnitude of the magnetic field in the first direction in the first orientation increases, and indicates the physical quantity which becomes smaller as the magnitude of the magnetic field in the opposite direction to the first direction in the first orientation increases. The second magnetic detection portion, which is the other one, indicates a physical quantity which becomes larger as the magnitude of the magnetic field in the second direction in the second orientation that crosses the first orientation increases; and indicates the physical quantity which becomes smaller as the magnitude of the magnetic field in the opposite direction to the second direction in the second orientation increases. The physical quantity may be, for example, a resistance value, or may be a voltage value.

Furthermore, this magnetic sensor comprises the first testing coil for generating a magnetic field whose magnitude and direction change In the first orientation to apply the generated magnetic field to the first magnetic detection portion; the second testing coil for generating a magnetic field whose magnitude and direction change in the second orientation to apply the generated magnetic field to the second magnetic detection portion: the electric current supply source; the connection conductor; and the conduction control circuit. The first testing coil and the second testing coil are connected in series to the electric current supply source by the connection conductor. The state of the first testing coil and the second testing coil is controlled so that each of them can be in either a conductive state or an unconductive state. In this case, each of these testing coils (the first testing coil and the second testing coil) may be formed by connecting the first spiral conductor and second spiral conductor, or may assume a shape shown in FIG. 33.

With the above structure, since the first testing coil and the second testing coil are connected in series to the electric current supply source, the magnitude of electric current passing through one of these coils is always the same as the current passing through the other one of these coils. It is therefore possible to easily keep the ratio between the magnitude of the magnetic field applied to the first magnetic detection portion by the first testing coil and the magnitude of the magnetic field applied to the second magnetic detection portion by the second testing coil an expected value (e.g., "1"). As a result, it is possible to determine (it becomes worth determining) whether the ratio between the physical quantity indicated by the first detection portion and the physical quantity indicated by the second detection portion is the expected value (e.g., approximately "1") or not.

In this respect, description will be made with using a concrete example. In this example, it is assumed that the first magnetic detection portion is configured so as to indicate the physical quantity of a first magnitude when the magnetic field of a predetermined magnitude in the first direction is applied, and that the second magnetic detection portion is configured so as to indicate the physical quantity of the same magnitude as the first magnitude when the magnetic field of the same magnitude as the predetermined magnitude in the second direction is applied. It is also assumed that the first testing coil is configured in a shape, the number of windings, and so on in a manner to apply a magnetic field of a predetermined magnitude Hb in the first direction to the first magnetic detection portion when an electric current of a predetermined magnitude (in a certain direction) is passing therethrough; and the second testing coil is configured in a shape, the number of windings, and so on in a manner to apply a magnetic field of the same magnitude as the predetermined magnitude Hb in the second direction to the second magnetic detection portion when an electric current of the same magnitude as the predetermined magnitude is passing therethrough in a predetermined direction.

In this case, according to the structure above, since the first testing coil and the second testing coil are connected in series to the electric current supply source, the electric current of the same magnitude is made flow through (or passes in) the first testing coil and the second testing coil, regardless of the characteristics of the conduction control circuit (e.g., regardless of resistance values of switching transistors in the case where the conduction control circuit comprises switching transistors for switching the state between the conductive state and the unconductive state). Therefore, the first testing coil and the second testing coil will apply the magnetic fields of the identical magnitude Hb in each corresponding direction to each corresponding magnetic detection portions.

Thus, the first and second magnetic detection portions are expected to indicate the physical quantity of the identical magnitude (i.e., the ratio is expected to be "1"). Therefore, if the difference of the physical quantities indicated by the first and second magnetic detection portions is larger than a predetermined value, it is possible to determine that the balance between the first and second magnetic detection portions is lost.

Specifically, unlike the features of the present invention, if the electric current supply source and the conduction control circuit for the first testing coil, and the electric current supply source and the conduction control circuit for the second testing coil are formed independently each other, it is difficult to apply the electric currents of the same magnitude to the first testing coil and the second testing coil because of the difference in the characteristics between the two electric current supply sources and because of the difference in the characteristics between the two conduction control circuits. As a consequence, in the configuration which does not use the present invention, the magnitude of the magnetic field generated by the first testing coil and the magnitude of the magnetic field generated by the second testing coil are sometimes not the same. Thus, even if the physical quantity indicated by the first magnetic detection portion and the physical quantity indicated by the second magnetic detection portion are different, the balance between both the detecting portions might not be lost. Therefore, it is not possible to determine that the balance between both the detecting portions is lost in such a situation.

Contrarily, according to the features of the present invention, since the first testing coil and the second testing coil are connected in series to share the electric current supply source and the conduction control circuit, the magnitude of electric currents passing through these coils are not different. It is therefore possible to certainly determine whether or not the balance in the characteristics between the first magnetic detection portion and the second magnetic detection portion is lost.

Note that the first testing coil and the second testing coil may be formed separately from the first magnetic detection portion and the second magnetic detection portion, or they may be formed within the same substrate (chip) with the first magnetic detection portion and the second magnetic detection portion. Particularly, if the first testing coil and the second testing coil are formed within the same substrate with the first magnetic detection portion and the second magnetic detection portion, a magnetic sensor which is a small and inexpensive single chip including testing portions (units) can be provided.

According to a third aspect of the present invention there is provided such a magnetic sensor, further comprising a detection circuit for selecting either the first magnetic detection portion or the second magnetic detection portion in response to an instruction signal from exterior, to detect a physical quantity indicated by the selected magnetic detection portion; and a control circuit for generating the instruction signal; wherein the first magnetic detection portion is configured so as to indicate the physical quantity of a first magnitude when the magnetic field of a predetermined magnitude is applied in the first direction in the first orientation, the first magnetic detection portion being configured so as to indicate the physical quantity of a second magnitude different from the first magnitude when the magnetic field of the predetermined magnitude is applied in the opposite direction to the first direction in the first orientation, wherein the second magnetic detection portion is configured so as to indicate the physical quantity of the first magnitude when the magnetic field of the predetermined magnitude is applied in the second direction in the second orientation, the second magnetic detection portion being configured so as to indicate the physical quantity of the second magnitude when the magnetic field of the predetermined magnitude is applied in the opposite direction to the second direction in the second orientation, and wherein when electric current of a predetermined magnitude flows in a predetermined direction through the first testing coil, the first testing coil applies a magnetic field of the predetermined magnitude in the first direction to the first magnetic detection portion and the second testing coil applies a magnetic field of the predetermined magnitude In the opposite direction to the second direction to the second magnetic detection portion, whereas when electric current of the predetermined magnitude flows in the opposite direction to the predetermined direction through the first testing coil, the first testing coil applies a magnetic field of the predetermined magnitude in the opposite direction to the first direction to the first magnetic detection portion and the second testing coil applies a magnetic field of the predetermined magnitude in the second direction to the second magnetic detection portion.

With above aspect, the magnetic field of the predetermined magnitude is applied to the first magnetic detection portion in the first direction in the first orientation when the electric current of the predetermined magnitude in the predetermined direction flows in the first testing coil. Therefore, if the detection circuit selects the first magnetic detection portion in accordance with the instruction signal from the external and detects the physical quantity indicated by the first magnetic detection portion, the detection results must be the physical quantity of the first magnitude (substantially the same magnitude as the first magnitude), as long as the selecting function of the detection circuit to select one of the magnetic detection portions is normal.

Similarly, the magnetic field of the predetermined magnitude is applied to the second magnetic detection portion In the opposite direction to the second direction, when the electric current of the predetermined magnitude in the predetermined direction flows in the first testing coil. Therefore, if the detection circuit selects the second magnetic detection portion in accordance with the instruction signal from the external and detects the physical quantity indicated by the second magnetic detection portion, the detection results must be the physical quantity of the second magnitude different from the first magnitude (substantially the same magnitude as the second magnitude), as long as the selecting function of the detection circuit to select one of the magnetic detection portions is normal.

Contrarily, in the case where the selecting function of the detection circuit is not normal, and the detection circuit selects the second magnetic detection portion although the instruction signal from the external indicates to select the first magnetic detection portion, the detection results of the detection circuit will be the physical quantity of the second magnitude (substantially the same magnitude as the second magnitude) which Is different from the first magnitude which is expected, when the electric current of the predetermined magnitude in the predetermined direction flows in the first testing coil, because the magnetic field of the predetermined magnitude is applied to the second magnetic detection portion by the second testing coil in the opposite direction to the second direction.

Similarly, in the case where the selecting function of the detection circuit is not normal, and the detection circuit selects the first magnetic detection portion although the Instruction signal from the external indicates to select the second magnetic detection portion, the detection results of the detection circuit will be the physical quantity of the first magnitude (substantially the same magnitude as the first magnitude) which is different from the second magnitude which is expected, when the electric current of the predetermined magnitude in the predetermined direction flows in the first testing coil, because the magnetic field of the predetermined magnitude is applied to the first magnetic detection portion by the first testing coil in the first direction.

That is, in the magnetic sensor configured as above, if the selecting function of the detection circuit is abnormal (i.e. the circuit is in a malfunction state), when the electric current of the predetermined magnitude in the predetermined direction is applied to the first testing coil, and when the physical quantity of the first magnetic detection portion is tried to be selected and detected in accordance with the instruction signal, the resulting (actual) detection amount will be the second magnitude while the first magnitude Is expected. Similarly, if the selecting function of the detection circuit is abnormal, when the electric current of the predetermined magnitude in the predetermined direction is applied to the first testing coil, and when the physical quantity of the second magnetic detection portion is tried to be selected and detected in accordance with the instruction signal, the resulting detection amount will be the first magnitude while the second magnitude is expected. Therefore, on the basis of such a combination of the instruction signal and the detection results, it is possible to determine whether or not the magnetic sensor (selecting function of the detection circuit) is abnormal.

It should be understood that, the same theory applies to the case where the control circuit makes the electric current of the predetermined magnitude In the opposite direction to the predetermined direction flow in the first testing coil. That is, if the selecting function of the detection circuit is abnormal and the electric current of the predetermined magnitude in the opposite direction to the predetermined direction is flowing in the first testing coil, when the physical quantity of the first magnetic detection portion Is tried to be detected In accordance with the instruction signal, the resulting detection amount will be the first magnitude while the second magnitude Is expected: or when the physical quantity of the second magnetic detection portion is tried to be detected in accordance with the instruction signal, the resulting detection amount will be the second magnitude while the first magnitude is expected. On the basis of such a combination of the instruction signal and the detection results, it is possible to determine whether or not the magnetic sensor (selecting function of the detection circuit) is abnormal.

Therefore, according to the magnetic sensor having such a structure, when there is a difference between the ideal detection value which is expected in accordance with the instruction signal from the external and the actual detection value, it is possible to determine that the detection circuit (magnetic sensor) is abnormal. It should be noted that, since various kinds of abnormality can be detected easily with such a structure as described above, it is optional whether to determine if the balance between the first magnetic detection portion and second magnetic detection portion is lost.

BRIEF DESCRIPTION OF THE DRAWINGS

The above and other objects, aspects, features and advantages of the present invention will become more apparent from the following detailed description when taken in conjunction with the accompanying drawings, in which.

DESCRIPTION OF THE PREFERRED EMBODIMENTS

Figure 1:
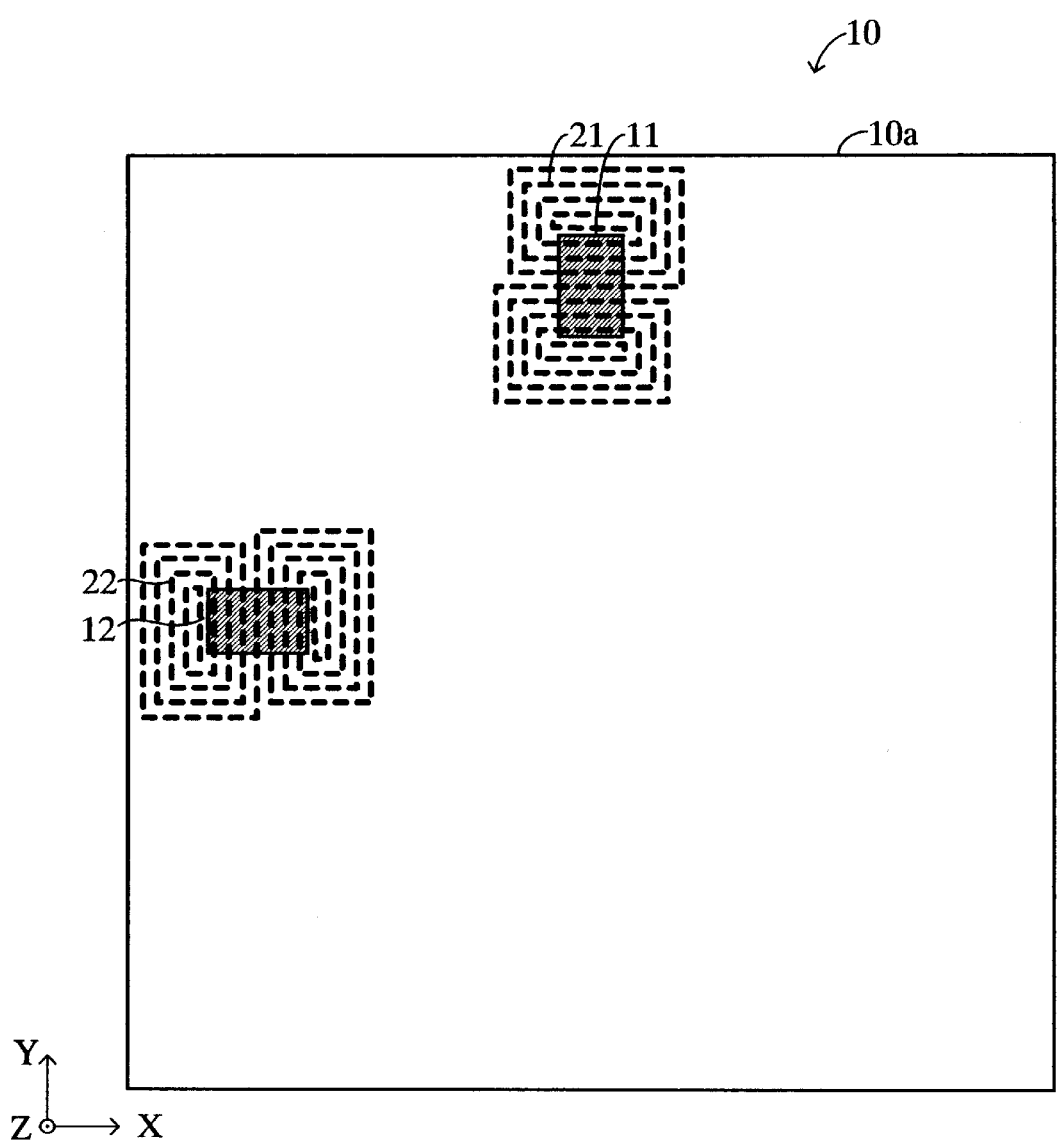
FIG. 1 is a schematic plan view of a magnetic sensor in accordance with a first embodiment of the present invention.

Embodiments of a magnetic sensor in accordance with the present invention will now be described with reference to the drawings. A magnetic sensor 10 in accordance with a first embodiment shown in FIG. 1, which is a schematic plan view, comprises a substrate 10a which Is made of, for example, $SiO_2$/Si, $Si_3N_4$/Si, glass or quartz. The substrate 10a assumes an almost square having sides extending along a X axis and a Y axis perpendicular to each other, and having a thickness in a direction of a Z axis perpendicular to the X axis as well as the Y axis. The magnetic sensor 10 also comprises two thin-film-like magnetic tunnel effect elements (groups) 11 and 12: and bias magnetic field coils 21 and 22 formed under (toward the side of the substrate 10a, i.e., on the side of a Z axis negative direction) the magnetic tunnel effect elements (groups) 11 and 12, respectively, and in a plane (i.e., X-Y plane) parallel to a planar film surface of the thin film. The bias magnetic field coils 21 and 22 apply (give) bias magnetic fields for detecting (measuring) an external magnetic field applied to the magnetic tunnel effect elements 11 and 12, respectively.

The magnetic tunnel effect elements (groups) 11 and 12 have the same structure each other, and the bias magnetic field coils 21 and 22 have the same structure each other, except for the position on the substrate 10a and direction when they are formed. Therefore, hereinafter, the magnetic tunnel effect element (group) 11 and the bias magnetic field coil 21 will be described as an example with reference to FIG. 2 to FIG. 5.

Figure 2:
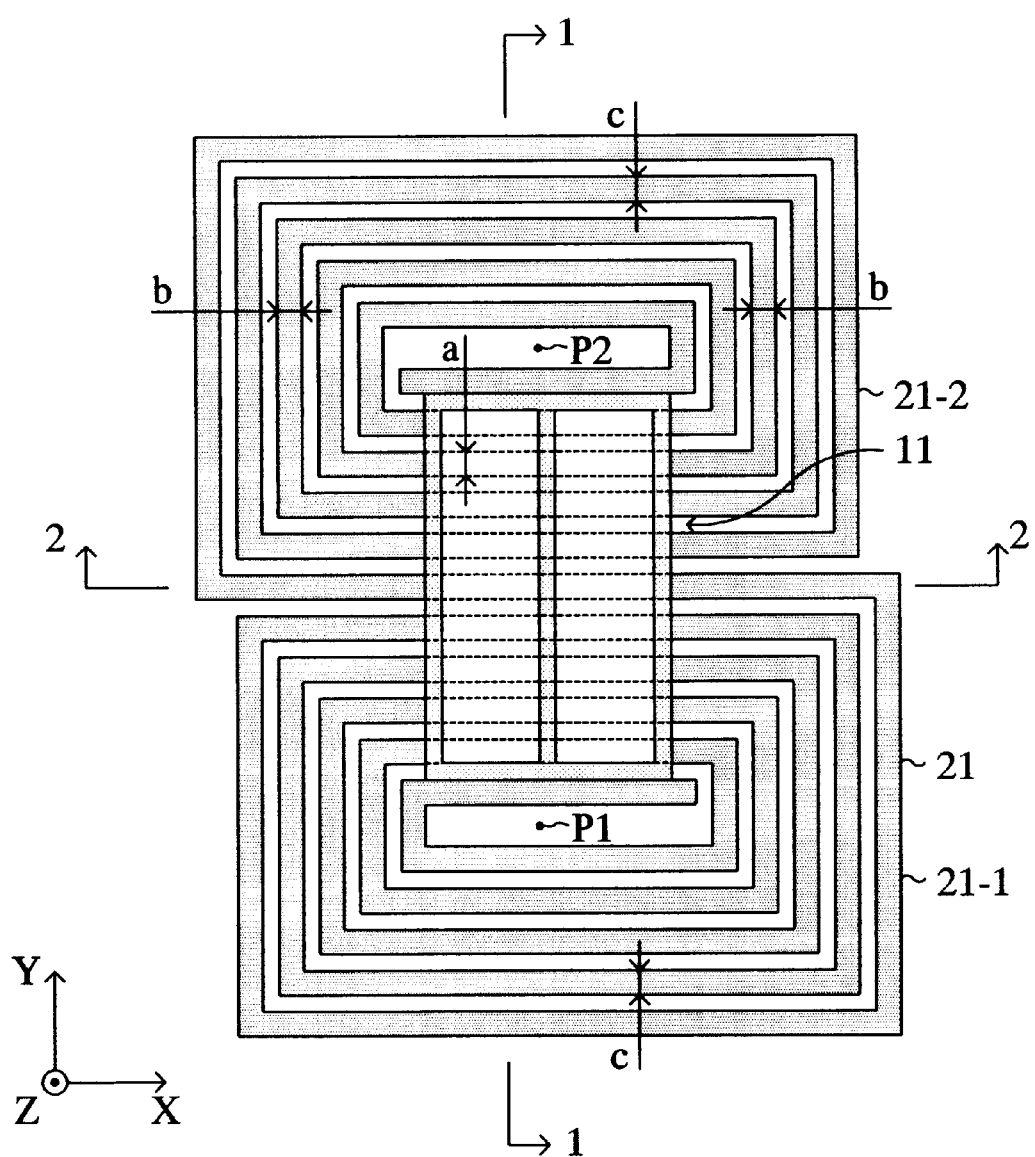
FIG. 2 is a partially enlarged plan view of a magnetic tunnel effect element (group) and a bias magnetic field coil of the magnetic sensor shown in FIG. 1.
Figure 3:
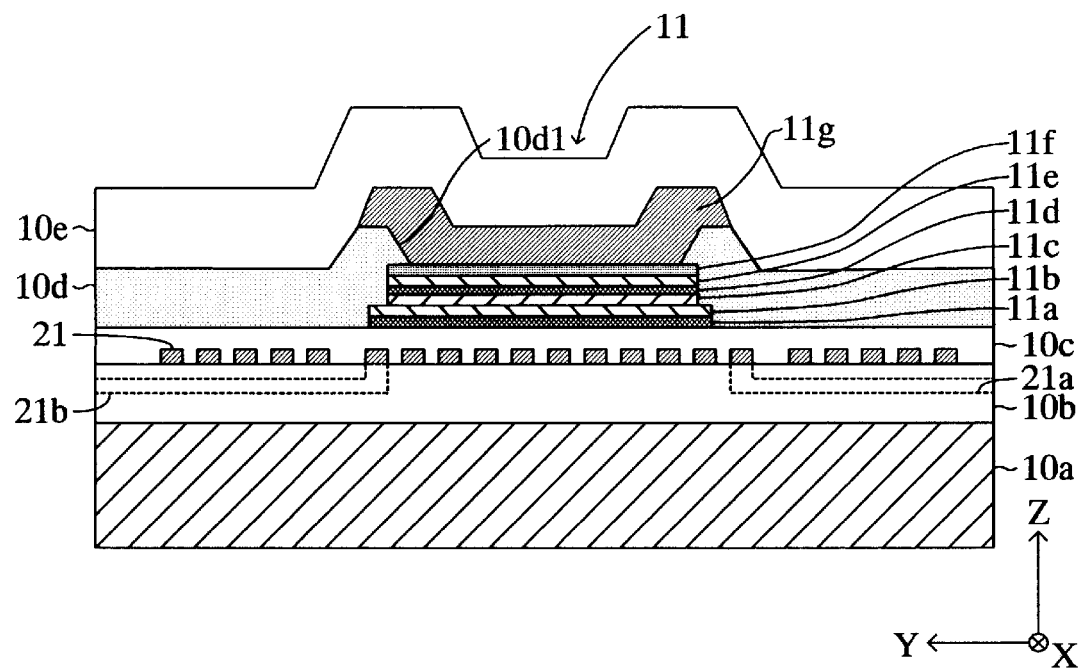
FIG. 3 is a sectional view of the magnetic tunnel effect element and the bias magnetic field coil cut by a plane along the line 1—1 of FIG. 2.
Figure 4:
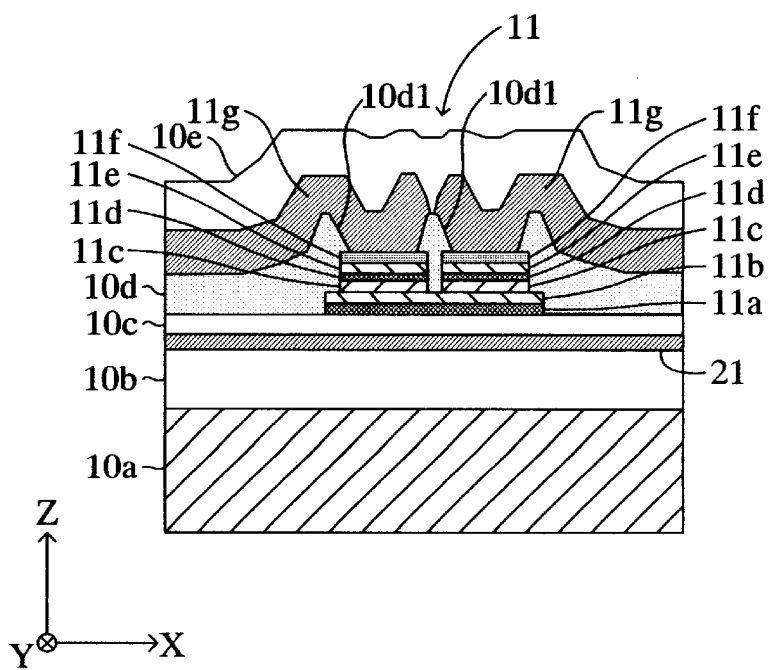
FIG. 4 is a sectional view of the magnetic tunnel effect element and the bias magnetic field coil cut by a plane along the line 2—2 of FIG. 2.

FIG. 2 is a partially enlarged plan view showing the shape and the relative position of the magnetic tunnel effect element (group) 11 and the bias magnetic field coil 21. In this drawing, an upper electrode, an interlayer insulating layer and the like of the magnetic tunnel effect element 11 are omitted. They will be described later. FIG. 3 and FIG. 4 are sectional views of the magnetic tunnel effect element 11 and the bias magnetic field coil 21 cut by a plane along the line 1—1 and by a plane along the line 2—2 of FIG. 2, respectively.

The magnetic tunnel effect element 11 comprises a first insulating layer 10b formed on the substrate 10a, and a second insulating layer 10c formed on the first insulating layer 10b. Lead line 21a is connected to one end of the bias magnetic field coil 21 and lead line 21b is connected to the other end of the bias magnetic field coil 21. These lines 21a and 21b are made of Al (aluminum) and buried in the first insulating layer 10b. The bias magnetic field coil 21 made of A1 is buried in the second insulating layer 10c.

A lower electrode 11a, whose planar surface is a rectangle having sides along the X axis and Y axis and which has a thickness in the Z axis direction, Is formed on the second insulating layer 10c. The lower electrode 11a is formed of a conductive nonmagnetic metallic material which Is Ta (or may be Cr or Ti), so as to have a film thickness of approximately 30 nm. An antiferromagnetic film 11b, which has the same planar shape as the lower electrode 11a, is made of PtMn having a film thickness of approximately 15 nm. The antiferromagnetic film 11b is formed on the lower electrode 11a.

On the antiferromagnetic film 11b, as shown in FIG. 4, a pair of ferromagnetic films 11c and 11c made of NiFe having a film thickness of approximately 20 nm is layered (cumulated) with leaving a space in the X axis direction each other. Each of the ferromagnetic films 11c and 11c has a rectangle shape in a plan view whose short and long sides extend along the X axis and Y axis, respectively, and is a thin film having a thickness in the Z axis direction. Each of the ferromagnetic films 11c and 11c is disposed in a manner as to have each long side opposes to each other in parallel. The ferromagnetic films 11c and 11c constitute a pinned layer in which the direction of magnetization is loosely fixed (pinned) in the direction of the short side (X axis positive direction) by the antiferromagnetic film 11b. That is, the ferromagnetic films 11c, 11c and the antiferromagnetic film 11b form a layer generally called a fixed magnetization layer, which is also called a sense layer in the present embodiment.

Insulating layers 11d, having the same shape in a plan view as the ferromagnetic films 11c, are each formed on each of the ferromagnetic films 11c. The Insulating layer 11d is made of $Al_2O_3$(Al—O) being an insulating material, and is formed to have a film thickness of approximately 1 nm.

Each of the ferromagnetic films 11e has the same shape in a plan view as the insulating layer 11d and is made of NiFe having a film thickness of approximately 80 nm. Each of the ferromagnetic films 11e is formed on each of the insulating layers 11d. This ferromagnetic film 11e constitutes a free layer (free magnetizing layer) whose direction of magnetization changes in response to the external magnetic field.

The ferromagnetic film 11e forms a magnetic tunnel junction structure with the pinned layer constituted of the ferromagnetic films 11c, and the insulating layers 11d. That is, the antiferromagnetic film 11b, the ferromagnetic films 11c, the insulating layers 11d and the ferromagnetic films lie constitute one magnetic tunnel effect element (except for the electrodes, etc.). In the present embodiment, the ferromagnetic film 11e is also called a referential (reference) layer.

Dummy layers 11f, which have the same shape in a plan view as each of the ferromagnetic films 11ee, are each formed on each of the ferromagnetic films 11ee. This dummy layer 11f is constituted of a conductive nonmagnetic metallic material made of a Ta film having a film thickness of approximately 40 nm.

An interlayer insulating layer 10d is provided in a region that covers the second insulating layer 10c, the lower electrode 11a, the antiferromagnetic film 11b, the ferromagnetic films 11c, the insulating layers 11d, the ferromagnetic films 11e and the dummy layers 11f. The interlayer insulating layer 10d is made of $SiO_2$, and its film thickness is approximately 250 nm.

Contact holes 10d1 and 10d1 are each formed in the interlayer insulating layer 10d on each of the dummy layers 11f. Upper electrodes 11g and 11g, which are, for example, made of Al having a film thickness of approximately 300 nm, are formed to bury the contact holes 10d1 therein so as to connect electrically each of the pair of dummy layers 11f and 11f to an IC circuit not shown. In this way, the lower electrode 11a and the upper electrodes 11g and 11g electrically connect each of the ferromagnetic films 11e and 11e and each of the ferromagnetic films 11c and 11c that form a pair of magnetic tunnel junction structures, thereby forming the magnetic tunnel effect element (group) 11 in which the directions of the magnetization of the pinned layers are identical each other. Thus, a plurality of (a pair of) magnetic tunnel junction structures are connected in series. In addition, a protecting layer 10e made of SiO and SiN is formed on the upper electrodes 11g and 11g.

The bias magnetic field coil 21 mentioned above is for applying (giving) an alternating (current) bias magnetic field, which changes in the Y axis direction, to the magnetic tunnel effect element (group) 11. As shown in FIG. 2, a linear conductor bends and turns at right angles in an X-Y plane (in a plane parallel to a plane constituted by each thin film of the magnetic tunnel effect element 11), and forms a pair of spirals each having substantially the same shape in a plan view ("in a plan views" means looking at the magnetic sensor from a position in the Z axis direction along the Z axis). That is, the bias magnetic field coil 21 comprises a first conductor (a first coil unit) 21-1 forming a spiral whose diameter gradually becomes larger from a spiral center P1 as it turns counterclockwise (it may also turn clockwise.) in a plan view, and a second conductor (a second coil unit) 21-2 forming a spiral whose diameter gradually becomes larger from a spiral center P2 as it turns counterclockwise in a plan view. Hereinafter, this coil 21 is sometimes called a double spiral type coil, in order to be distinguished from conventional coils (single spiral type coils).

The magnetic tunnel effect element 11 is disposed between the spiral center P1 of the first conductor 21-1 and the spiral center P2 of the second conductor 21-2 in a plan view. The bias magnetic field coil 21 is configured by connecting the outermost circumferential portion of the first conductor 21-1 to the outermost circumferential portion of the second conductor 21-2 in the shape of letter "S", so that when a predetermined potential difference is applied between the lead lines (portions) 21a and 21b, an electric current flows in the same direction in each of the conductors at least at a region which overlaps the magnetic tunnel effect element 11 in a plan view (i.e. an electric current flows in the same direction in each of the conductors that pass thorough this region).

Figure 5:
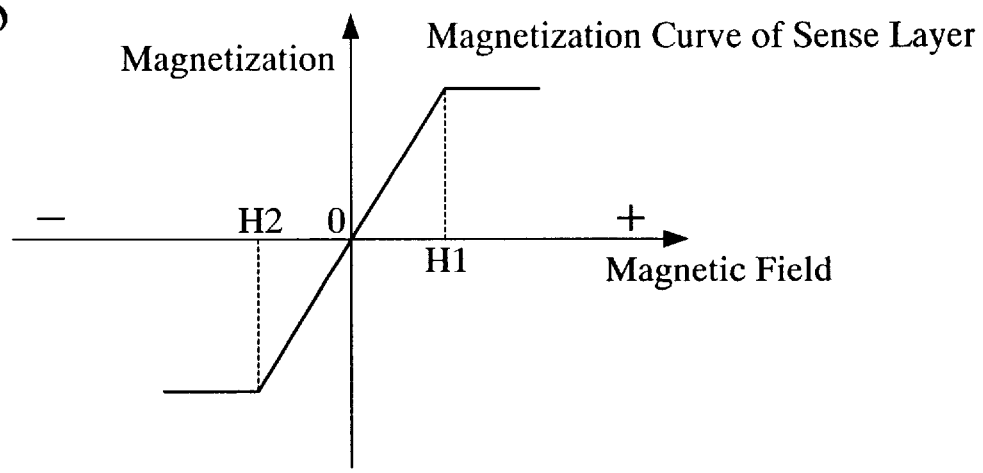
FIG. 5 is a graph showing a magnetization curve of a sense layer of the magnetic tunnel effect element shown in FIG. 1.

Now, the operation (principle for detecting magnetic field) of the magnetic tunnel effect element 11 configured as above will be described. As described above, the ferromagnetic film 11c of the sense layer has its magnetization loosely pinned in the short side direction (X axis positive direction). When a magnetic field, which changes its magnitude and direction within the orientation along the long side of the ferromagnetic film 11c (i.e., Y axis direction, and the orientation perpendicular to the direction of pinned magnetization), is given to the ferromagnetic film 11c, the direction of magnetization of the sense layer (ferromagnetic film 11c) gradually changes (turns), and the magnetization of the sense layer in the direction where the magnetic field changes varies as shown in FIG. 5, That is, (the magnitude of) the magnetization of the sense layer is approximately constant when the magnitude of the above magnetic field is larger than a saturation magnetic field H1 and when smaller than a saturation magnetic field H2, and the magnetization of the sense layer changes approximately in proportion to the magnitude of the magnetic field (approximately linearly) when the magnetic field is within the range between saturation magnetic fields H2 and H1.

Figure 6:
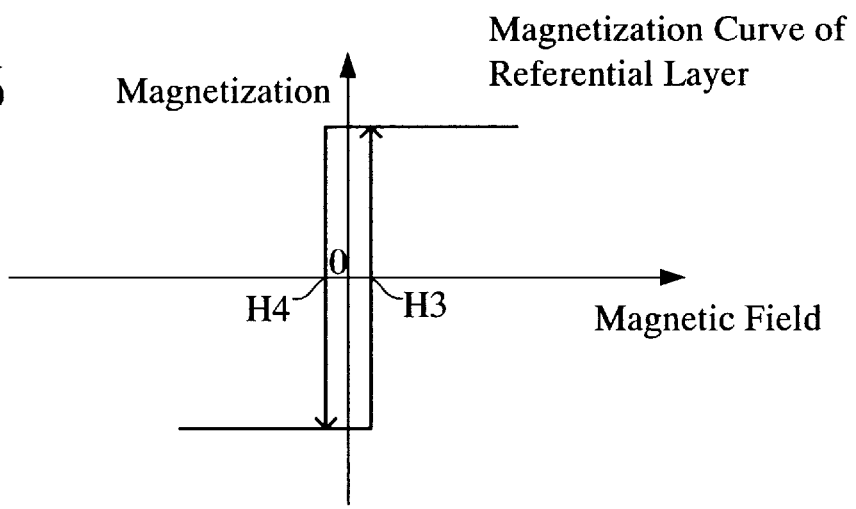
FIG. 6 is a graph showing a magnetization curve of a referential layer of the magnetic tunnel effect element shown in FIG. 1.

On the other hand when the magnetic field mentioned above (magnetic field whose magnitude and direction change in the Y axis direction) is applied to the ferromagnetic film lie of the referential layer, the magnetization of the referential layer in the direction where the magnetic field changes varies as shown in FIG. 6. That is, (the magnitude of) the magnetization of the referential layer is approximately constant when the magnitude of the above magnetic field is larger than a saturation magnetic field H3 and when smaller than a saturation magnetic field H4, and the magnetization of the referential layer changes stepwise when the magnitude of the magnetic field corresponds with the saturation magnetic fields H3 and H4. The magnetization characteristics of this referential layer stem from shape anisotropy of the ferromagnetic film 11e that the direction of magnetization coordinate with the longitudinal direction (long side direction, major axis direction).

Figure 7:
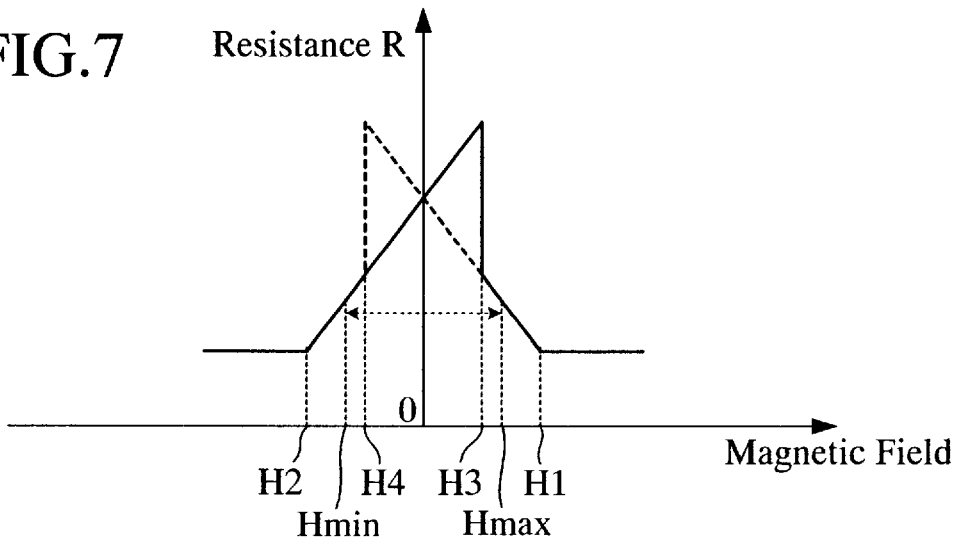
FIG. 7 is a graph showing an MR curve (resistance change for the magnetic field) of the magnetic tunnel effect element shown in FIG. 1.

As a result, resistance R of the magnetic tunnel effect element 11 changes as shown in FIG. 7. In FIG. 7, the solid line indicates a resistance value change when the magnetic field changes from negative to positive, and the broken line indicates a resistance value change when the magnetic field changes from positive to negative. As apparent from FIG. 7, the resistance value is an even function with respect to the magnetic field (the resistance is axisymmetric with respect to the y axis, when the magnetic field is plotted along the x axis (x-coordinate) and the resistance is plotted along the y axis (y-coordinate) perpendicular to the x axis as shown in the graph of FIG. 7).

Figure 8:
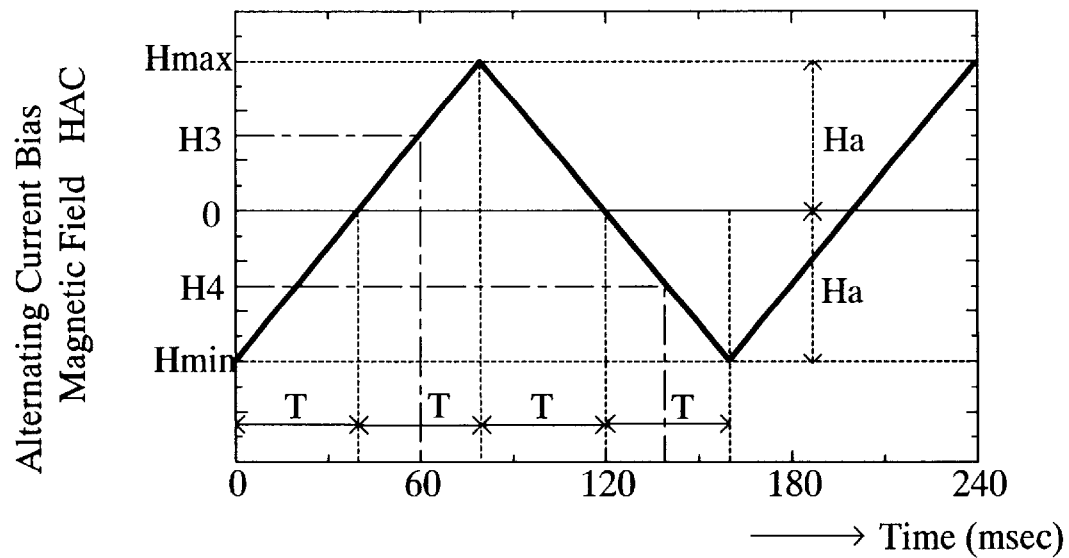
FIG. 8 is a graph showing an alternating (current) bias magnetic field applied to the magnetic tunnel effect element shown in FIG. 1.

In the present magnetic sensor 10, an alternating (current) bias magnetic field HAC, which changes in the Y axis direction (long side direction of the ferromagnetic film 11e) in the form of a triangular wave as shown in FIG. 8, is given to the magnetic tunnel effect element 11 with using the coil 21. This alternating current bias magnetic field HAC is a magnetic field that linearly changes (sweeps) at a period 4T between a maximum value Hmax (=Ha>0) and a minimum value Hmin (=−Ha) equal to a value that inverted the sign of the absolute value of the maximum value Hmax. This maximum value Hmax of the alternating current bias magnetic field HAC is set to be larger than the saturation magnetic field H3 of the referential layer, and smaller than the saturation magnetic field H1 of the sense layer. Similarly, the minimum value Hmin of the alternating current bias magnetic field is set to be smaller than the saturation magnetic field H4 of the referential layer, and larger than the saturation magnetic field H2 of the sense layer.

Figure 9:
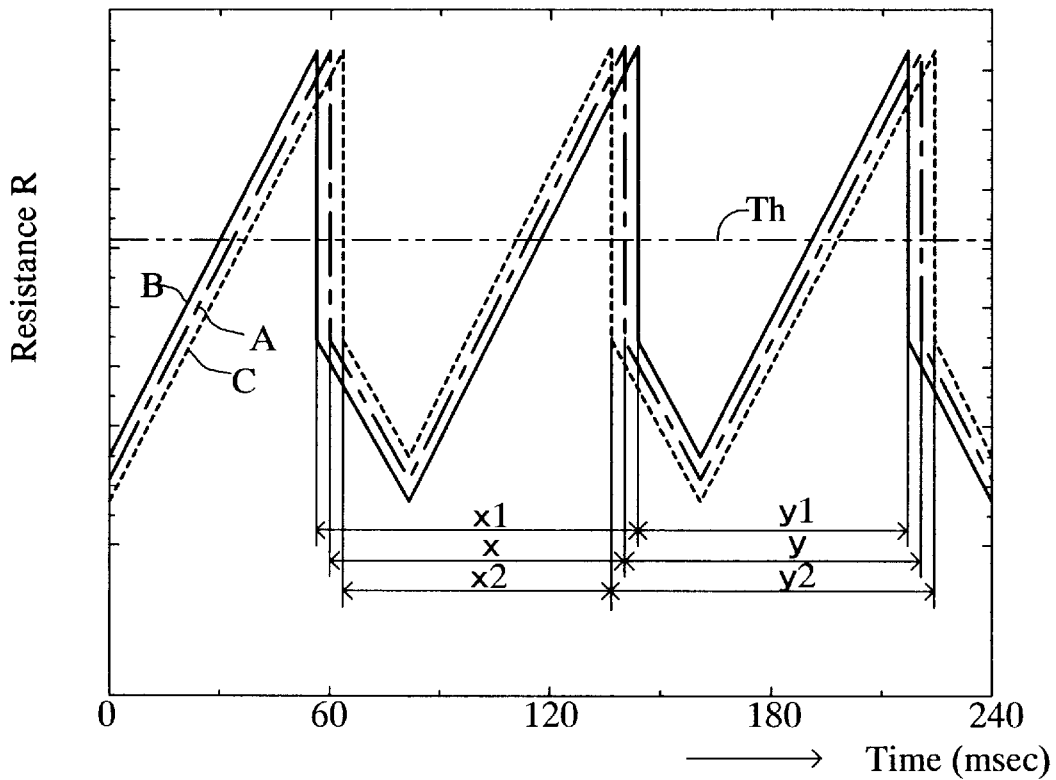
FIG. 9 is a graph showing a resistance change of the magnetic tunnel effect element shown in FIG. 1 in the case where the alternating (current) bias magnetic field shown in FIG. 8 is applied to the magnetic tunnel effect element and an external magnetic field to be detected is changed.

If such an alternating current bias magnetic field HAC is given to the magnetic tunnel effect element 11, and an external magnetic field h to be detected is changed in the direction parallel to the alternating current bias magnetic field HAC, the resistance R of the magnetic tunnel effect element 11 changes as shown in FIG. 9. In FIG. 9, the dashed line A indicates the resistance R when the external magnetic field h to be detected is "0", the solid line B indicates the resistance R when the external magnetic field h is a certain positive value (with respect to the Y axis direction), and the broken line C indicates the resistance R when the external magnetic field h is a certain negative value (with respect to the Y axis direction).

The magnetic sensor 10 measures a time x (or x1, x2) between a first instant and a second instant. The first instant is when the resistance R of the magnetic tunnel effect element 11 crosses a threshold value Th downward from above the value Th, and the second instant is when the resistance R crosses the threshold value Th downward from above the value Th next time. The magnetic sensor 10 also measures a time y (or y1, y2) between the second instant and a third instant that the resistance R further crosses the threshold value Th downward from above the value Th. The magnetic sensor 10 comprises the IC circuit not shown for outputting a detection value D expressed by Equation 1 as follows:

$$D = x/(x+y) \qquad \text{[Equation 1]}$$

Figure 10:
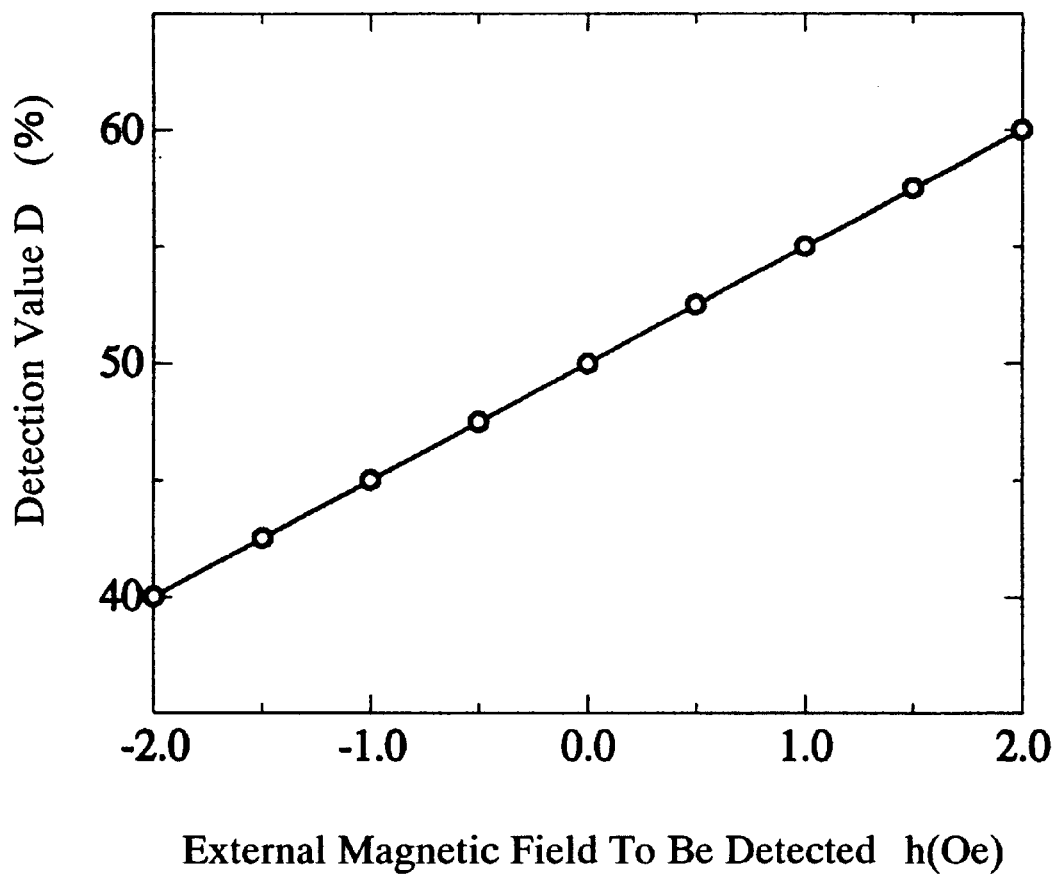
FIG. 10 is a graph showing the change of the detection value of the magnetic tunnel effect element shown in FIG. 1 for the magnetic field to be detected.

This detection value (duty) D, as shown in FIG. 10, is proportional to (the magnitude of) the external magnetic field to be detected, and changes depending upon a maximum value Ha of the alternating current bias magnetic field HAC. On the other hand, the detection value D is not dependent upon the output characteristics change of the magnetic tunnel effect element 11. Therefore, even if the output characteristics of the magnetic tunnel effect element (group) 11 change because of an element temperature change or deterioration, the magnetic sensor 10 compensates this change and can accurately detect the significantly minute magnetic field in the Y axis direction, The time x (or x1, x2) may be a time between a first instant that the resistance R crosses the threshold value Th upward from below the value Th and a second instant that the resistance R crosses the threshold value Th upward from below the value Th next time, and the time y (or y1, y2) may be a time between the second instant and a third instance that the resistance value R further crosses the threshold value Th upward from below the value Th next time. In addition, the detection value D may be $D=y/(x+y)$, instead.

With reference to FIG. 1 again, the bias magnetic field coil 21 is connected to an control circuit (not shown), and gives the alternating current bias magnetic field HAC to the magnetic tunnel effect element 11. On the other hand, the magnetic tunnel effect element 12 is equivalent to the magnetic tunnel effect element 11 that is formed on the substrate 10a in the state turned counterclockwise at 90° The bias magnetic field coil 22 is connected to the control circuit (not shown), and gives the alternating current bias magnetic field HAC that changes in the X axis direction to the magnetic tunnel effect element 12. As a result, the magnetic tunnel effect elements 11 and 12 form a Y axis magnetic sensor for detecting the magnetic field in the Y axis direction and an X axis magnetic sensor for detecting the magnetic field in the X axis direction, respectively.

Each of the coils 21 and 22 is a double spiral type coil having a pair of spirals in a plan view, and thus has a small occupancy area and consumes less power. Hereinafter, this aspect will be described with comparing the coil 21 shown in FIG. 2 to the conventional coil 110 shown in FIG. 33. For easy comparison, in FIG. 2 and FIG. 33, the width of the conductors forming each coil and the width of space between adjacent conductors are each made identical, and nine conductors pass the region immediately under the magnetic tunnel effect element 11 and 100 (the portion overlapped by the magnetic tunnel effect elements 11 or 100 in a plan view).

Figure 33:
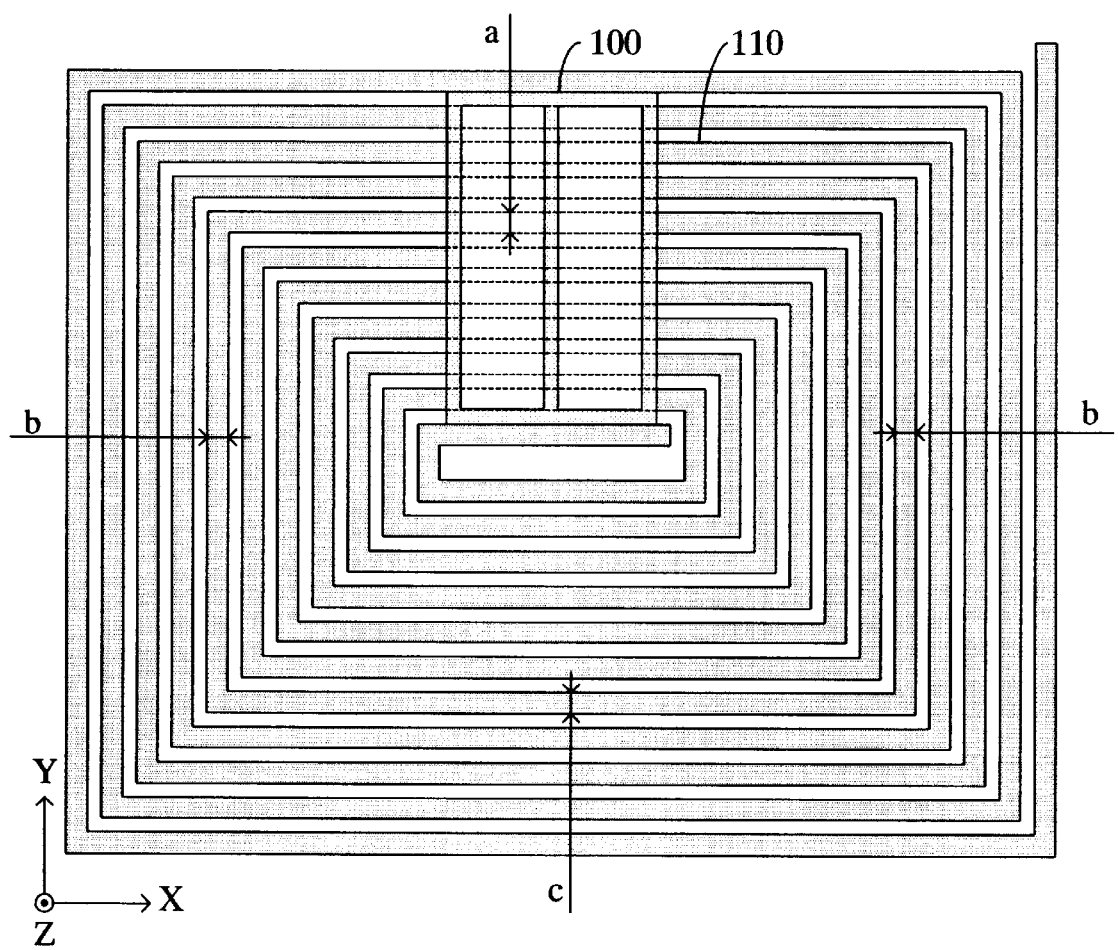
FIG. 33 is a partially enlarged plan view of a magnetic tunnel effect element (group) and a bias magnetic field coil of a conventional magnetic sensor.

First, having a look at the occupancy area, it will be understood that because the coil 21 has a great proportion of the conductor part (part of the conductors passing immediately under the magnetic tunnel effect element 11) that contributes to the generation of the bias magnetic field to the entire coil 21, the coil 21 is obviously smaller than the coil 110. In fact, if the coil 100 in the conventional form shown in FIG. 33 is formed with the width of the conductor being 5.6 $\mu$m, the width of the space between the adjacent conductors being 0.7 $\mu$m, and the size of the magnetic tunnel effect elements 11 and 100 being 120×64 $\mu$m$^2$, the area of the coil 110 will be 282×332 $\mu$m$^2$. On the contrary, if the double spiral type coil 21 shown in FIG. 2 is formed with the same width and the same space as the coil 100, the area thereof will be 191×286 $\mu$m$^2$.

Next, electrical numerical values of two bias magnetic field coils are obtained when each of the two coils generates the bias magnetic field of 15 Oe to the magnetic tunnel effect elements 11 or 100. One of the two coils is the single spiral type coil as the conventional coil 110. The other coil is the double spiral type coil as the coil 21. The size of both the magnetic tunnel effect elements 11 and 100 is 60×120 $\mu$m$^2$. The results are shown in Table 1.

TABLE 1

| Pattern | a ($\mu$m) | b ($\mu$m) | c ($\mu$m) | N (turn) | R ($\Omega$) | I (mA) | V (V) | W (mW) |
|---|---|---|---|---|---|---|---|---|
| Pattern A | 2 | 2 | 2 | 45 | 494.4 | 20.3 | 10.0 | 202.7 |
| Pattern B | 3 | 3 | 3 | 33 | 248.3 | 27.8 | 6.9 | 191.2 |
| Pattern C | 4 | 4 | 4 | 26 | 150.2 | 35.3 | 5.3 | 186.6 |
| Pattern D | 5 | 5 | 5 | 22 | 105.8 | 42.8 | 4.5 | 193.4 |
| Pattern B | 5 | 5 | 5 | 10 × 2 | 62.7 | 42.8 | 2.7 | 114.6 |
| Pattern F | 5 | 8 | 11 | 10 × 2 | 57.2 | 42.8 | 2.4 | 104.5 |

In Table 1, Patterns A to D mean the conventional single spiral type coils, and Patterns E and F mean the double spiral type coils in accordance with the present invention. In table 1, as shown in FIG. 2 and FIG. 33, "a" is the width of the conductors (conductors contributing directly to generating the bias magnetic field) passing immediately under the magnetic tunnel effect elements 11 or 100; "b" is the width of the conductors extending in parallel with each long side of the magnetic tunnel effect elements 11 or 100 (i.e., width of the conductors located outside of the both sides of the magnetic tunnel effect elements 11 or 100 extending along the X axis direction); "c" is the width of the conductors which are not in the part immediately under the magnetic tunnel effect elements 11 or 100, and extend in parallel with the short sides of the magnetic tunnel effect elements 11 or 100; "N" is the number of windings of spirals; "R" is the resistance of each coil; "I" is the electric current of each coil; "V" is the voltage between both ends of each coil: and "W" is the power consumption of each coil. In any part of each coil, the width of the space between the adjacent conductors is 0.7 μm.

Here, the way to obtain each numerical value shown in Table 1 will be simply described. First, in order to generate a magnetic field of 1 Oe in the upper portion of the coil, an electric current i necessary per unit width of the conductor constituting the coil (i.e., electric current density) is determined. Then, by considering the electric current i, and the sum of the width of the conductor of the coil and the width of the space between the adjacent conductors (i.e.,(a+0.7) μm), an electric current I necessary to generate the magnetic field of 15 Oe in the upper portion of the coil is determined in accordance with Equation 2 below.

$$I = i \cdot 15 \cdot (a+0.7) \qquad \text{[Equation 2]}$$

On the other hand, the turn number N of the coil is determined by dividing the length (120 μm) of the long side of the element by the sum of the width of the conductor of the coil and the width of the space between the adjacent conductors (i.e.,(a+0.7) μm). As described above, the shape of the coil is determined, and the resistance R is obtained based on the overall length of the coil, the sheet resistance value of a material (in this case Al) used for the coil, and the widths of the conductor in each part of the coil "a", "b" and "c". Then, the voltage V and the power consumption W are determined based on the electric current I and the resistance R.

As understood from Table 1, when all the widths of the conductor "a" to "c" are made identical each other, the conventional single spiral type coils shown by Pattern A to D require the greater electric current I, the smaller number of windings N and the lower voltage V, as the widths of the conductor "a" to "c" become larger. The power consumption W becomes minimum when each of the widths of the conductor "a" to "c" is approximately 4 μm (see Pattern C).

On the contrary, using the double spiral type coil in accordance with the present invention shown by Pattern E can make the resistance R, the voltage V between both ends and the power consumption W significantly lower, compared with the conventional coils. For example, as understood from the comparison between Pattern D and Pattern E, the coil of Pattern E can lower the power consumption to approximately half of that of the conventional coils. The coil of Pattern E can make the power consumption W significantly low, even if it is compared with the coil of Pattern C whose the power, consumption W is close to the minimum value.

Furthermore, as understood from Table 1, the coil in accordance with the present invention can reduce the voltage V between both ends. Therefore, the coil in accordance with the present invention can always generate the magnetic field of necessary magnitude even if the voltage of the power supply source is low. In addition, as understood from the comparison between pattern E and Pattern P, the power consumption W can further be reduced by adjusting the widths of the conductor "b" and "c" in the part that is not positioned immediately under the element in accordance with the present invention. That is, the power consumption W can be decreased by equalizing each width "a" of the first and second conductors positioned in the portion which overlaps the magnetic tunnel effect element 11, which is the magnetoresistive effect element, in a plan view, and by making width "a" different from each width "b" and "c" of the first and second conductors positioned in the other portion.

As described above, according to the first embodiment, the bias magnetic field is given to the TMR element having the sense layer and the referential layer to detect the external magnetic field, thereby providing the magnetic sensor whose characteristics for detection is unchanged. In addition, according to the first embodiment, since the coil is the double spiral type coil, the magnetic sensor that is small and consumes lower power is provided. It should be understood that each of the magnetic tunnel effect elements (group) 11 and 21 of the magnetic sensor 10 is the one in which a pair of magnetic tunnel effect elements are connected in series, however, it may be the one in which more magnetic tunnel effect elements are connected in series.

Next, a second embodiment of the magnetic sensor in accordance with the present invention will be described. The magnetic sensor in the first embodiment employs the TMR elements, however, the magnetic sensor in the second embodiment is different in that it employs GMR elements (giant magnetoresistive effect element) comprising a pin layer including a pinned layer and a pinning layer, a spacer layer, and a free layer. Further, the coils 21 and 22 In the first embodiment generate the bias magnetic field for detecting the external magnetic field, however, coils in the second embodiment is different in that they generate an initializing magnetic field for initializing the direction of magnetization in the free layer of the GMR elements.

Figure 11:
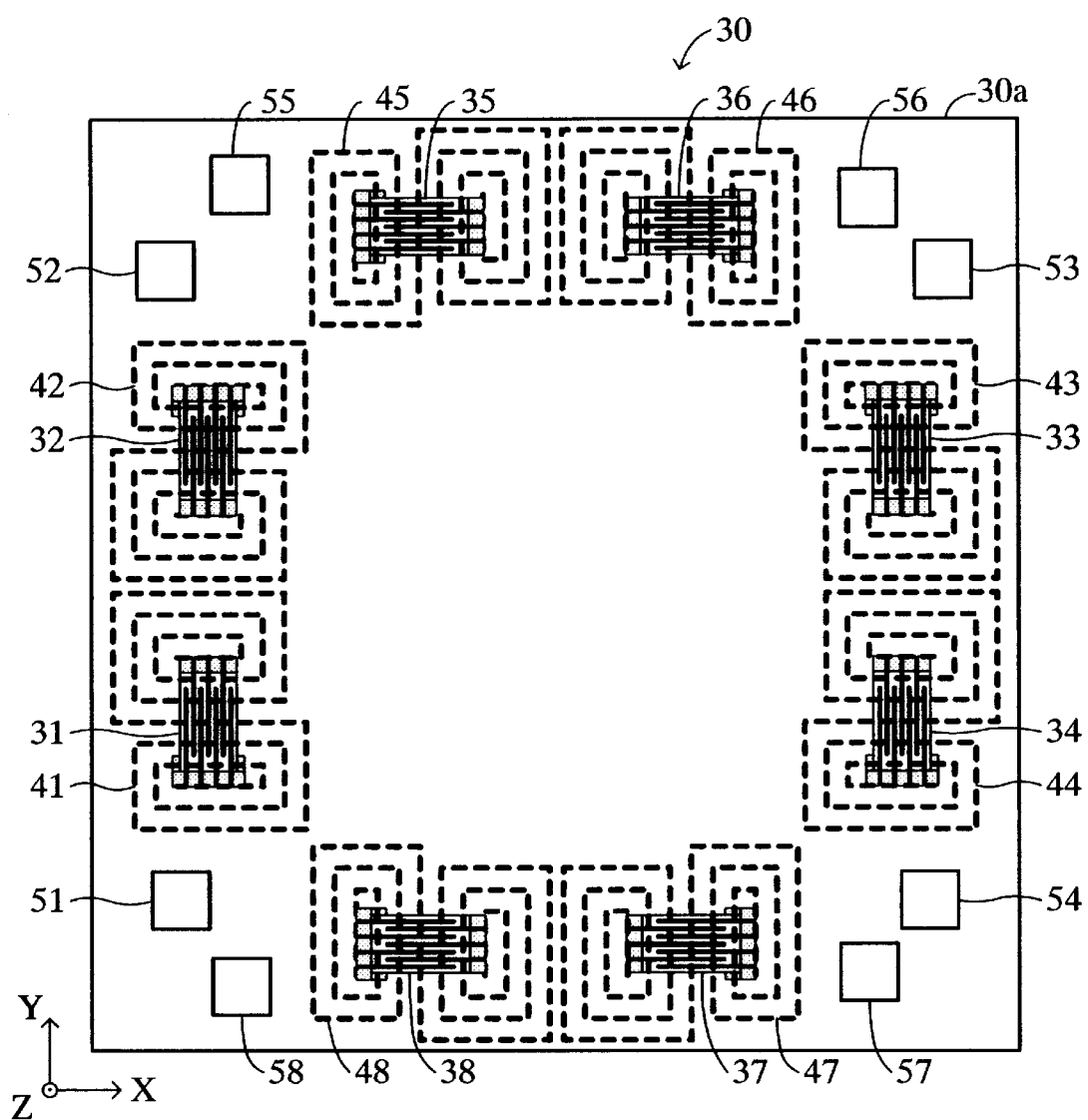
FIG. 11 is a schematic plan view of the magnetic sensor in accordance with a second embodiment of the present invention.

More concretely, as shown in FIG. 11, a magnetic sensor 30 in the second embodiment comprises a substrate 30a made of quartz glass (or may be $SiO_2$/Si, or $Si_3N_4$/Si), which has a rectangular shape (almost square shape) having sides along the X axis and Y axis perpendicular to each other, and has a little thickness in the Z axis direction perpendicular to the X axis and Y axis; a total of eight GMR elements 31 to 38 formed on the substrate 30a; initializing coils 41 to 48 for giving (applying) the initializing magnetic field to each of the GMR elements 31 to 38, respectively; and control circuits 51 to 58 which are connected to each of the coils 41 to 48, respectively, to give a predetermined potential difference to both ends of each of the coils 41 to 48.

The first X axis GMR element 31 is formed at a portion a little downward from the almost central part in the Y axis direction of the substrate 30a and in the vicinity of an end portion of the X axis negative direction. The direction of pinned magnetization of the pinned layer of the GMR element 31 is in the X axis negative direction. The second X axis GMR element 32 is formed at a portion a little upward from the almost central part in the Y axis direction of the substrate 30a and in the vicinity of an end portion of the X axis negative direction. The direction of pinned magnetization of the pinned layer of the GMR element 32 is in the X axis negative direction. The third X axis GMR element 33 is formed at a portion a little upward from the almost central part in the Y axis direction of the substrate 30a and in the vicinity of an end portion of the X axis positive direction. The direction of pinned magnetization of the pinned layer of the GMR element 33 is in the X axis positive direction. The fourth x axis GMR element 34 is formed at a portion a little downward from the almost central part in the Y axis direction of the substrate 30a and in the vicinity of an end portion of the X axis positive direction. The direction of pinned magnetization of the pinned layer of the GMR element 34 is in the X axis positive direction.

The first Y axis GMR element 35 is formed on the left side of the almost central part in the X axis direction of the substrate 30a and in the vicinity of an end portion of the Y axis positive direction. The direction of pinned magnetization of the pinned layer of the GMR element 35 is in the X axis positive direction. The second Y axis GMR element 36 is formed on the right side of the almost central part in the X axis direction of the substrate 30a and in the vicinity of an end portion of the Y axis positive direction. The direction of pinned magnetization of the pinned layer of the GMR element 36 is in the Y axis positive direction. The third Y axis GMR element 37 is formed on the right side of the almost central part in the X axis direction of the substrate 30a and in the vicinity of an end portion of the Y axis negative direction. The direction of pinned magnetization of the pinned layer of the GMR element 37 is in the Y axis negative direction. The fourth Y axis GMR element 38 is formed on the left side of the almost central part in the X axis direction of the substrate 30a and in the vicinity of an end portion of the Y axis negative direction. The direction of pinned magnetization of the pinned layer of the GMR element 38 is in the Y axis negative direction.

Each of the GMR elements 31 to 38 has the same structure and each of the coils 41 to 48 has the same structure, except for the position on the substrate 30a and direction when they are formed. Therefore, hereinafter, the first X axis GMR element 31 and the coil 41 will be described as an example.

Figure 12:
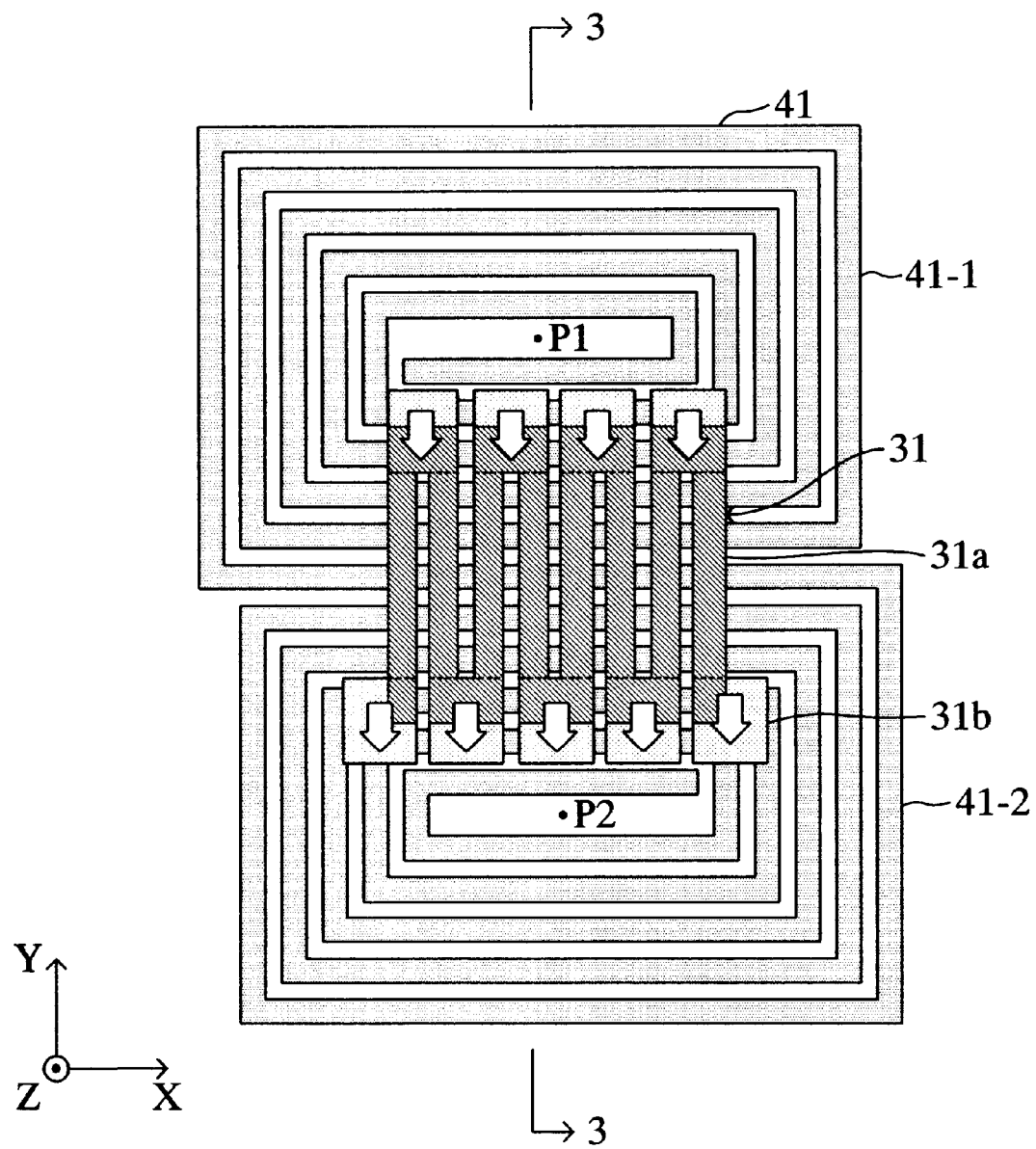
FIG. 12 is a partially enlarged plan view of a GMR element and a coil of the magnetic sensor shown in FIG. 11.
Figure 13:
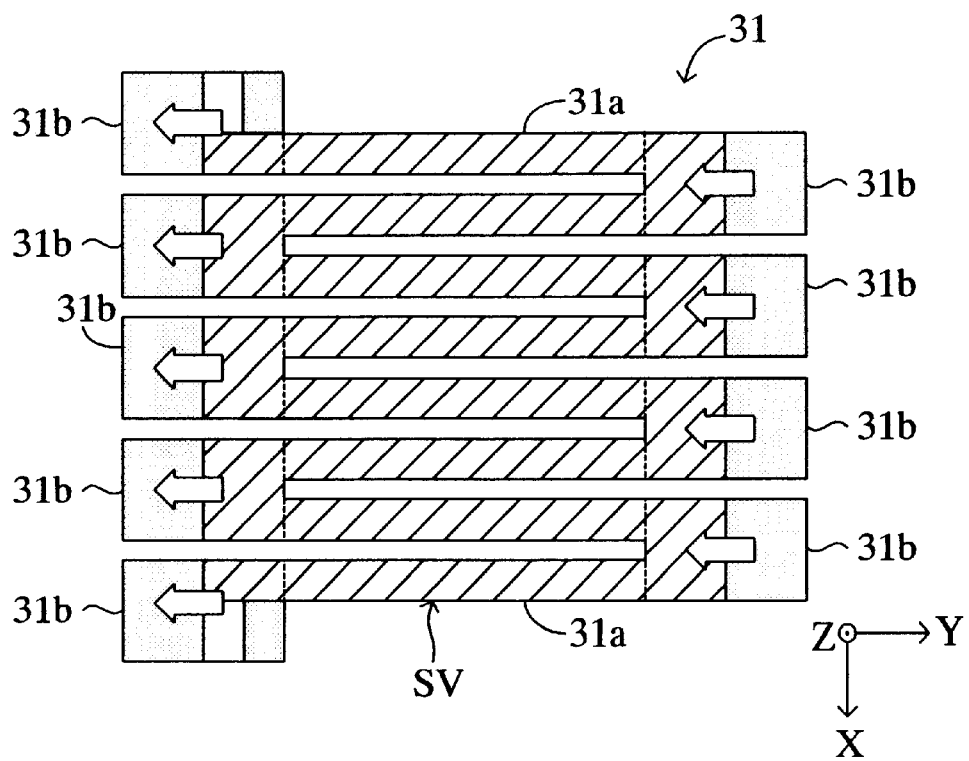
FIG. 13 is a plan view of the GMR element shown in FIG. 12.
Figure 14:
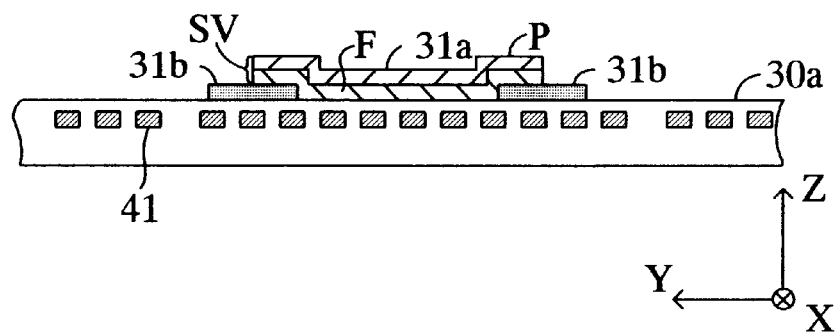
FIG. 14 is a schematic sectional view of the GMR element and the coil cut by a plane along the line 3—3 of FIG. 12.

A plan view of the first X axis GMR element 31 with the coil 41 is shown in FIG. 12. FIG. 13 is a enlarged plan view of the GMR element shown in FIG. 12. FIG. 14 is a schematic sectional view of the GMR element shown FIG. 12 cut by a plane along the line 3—3 of FIG. 12.

The first X axis GMR element 31, as shown in these Figs. comprises a plurality of narrow zonal portions 31a—31a made of spin valve film SV and having a longitudinal direction (a longer axis) in the Y axis direction; and bias magnet films (hard ferromagnetic thin film layer) 31b—31b that are made of hard ferromagnetic materials, having high coercive force and high squareness ratio, such as CoCrPt, and that are formed under the both ends of each narrow zonal portion 31a in the Y axis direction. Each of the narrow zonal portions 31a extends in the X axis direction on the upper surface of each of the bias magnet films 31b, and joins to the adjacent narrow zonal portion 31a.

Figure 15:
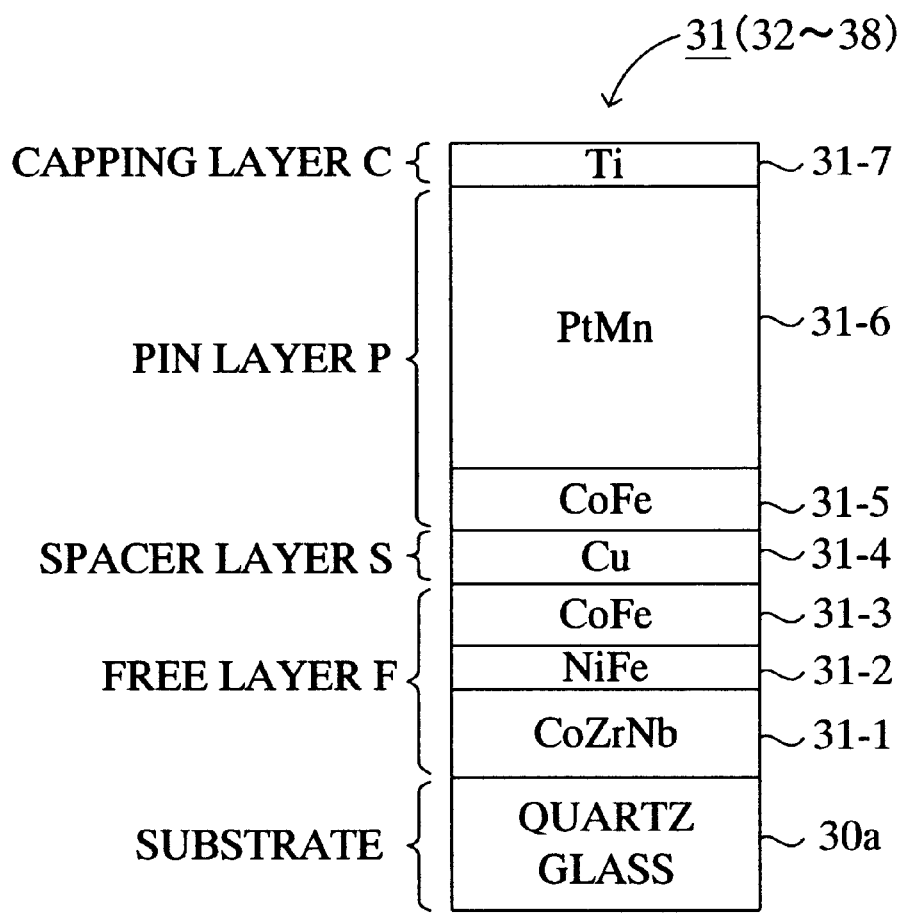
FIG. 15 illustrates the structure of a spin valve film of the GMR element shown in FIG. 12.

The spin valve film SV of the first X axis GMR element 31 includes a free layer (free magnetization layer) F, a conductive spacer layer S made of Cu having a thickness of 2.4 nm (24 Å), a pin layer (fixed layer, fixed magnetization layer) P, and a capping layer C made of titanium (Ti) or tantalum (Ta) having a thickness of 2.5 nm (25 Å), which are cumulated in order on the substrate 30a, as shown in FIG. 15 that illustrates the film structure.

The free layer F is a layer whose magnetization direction varies in accordance with the direction of the external magnetic field, and comprises a CoZrNb amorphous magnetic layer 31-1 formed directly on the substrate 30a and having a film thickness of 8 nm (80 Å), a NiFe magnetic layer 31-2 formed on the CoZrNb amorphous magnetic layer 31-1 and having a film thickness of 3.3 nm (33 Å), and a CoFe layer 31-3 formed on the NiFe magnetic layer 31-2 and having a film thickness of approximately 1 to 3 nm (10 to 30 Å). The CoZrNb amorphous magnetic layer 31-1 and NiFe magnetic layer 31-2 constitute a soft ferromagnetic material thin film layer. The CoFe layer 31-3 prevents Ni of the NiFe magnetic layer 31-2 and Cu 31-4 of the spacer layer S from diffusing. The bias magnet films 31b . . . 31b mentioned above give the bias magnetic field to the free layer F in the Y axis direction (Y axis negative direction indicated by wide arrows of FIG. 12 and FIG. 13) so as to maintain uniaxial anisotropy of the free layer F.

The pin layer P is made by superposing a CoFe magnetic layer 31-5 having a film thickness of 2.2 nm (22 Å), and an antiferromagnetic film 31-6 which is formed of a PtMn alloy Including 44 to 55 mol % of Pt and has a film thickness of 24 nm (240 Å). The CoFe magnetic layer 31-5 is in an exchange coupling manner to the magnetized antiferromagnetic film 31-6. Thus, the direction of magnetization of the CoFe magnetic layer 31-5 is pinned (fixed) in the X axis negative direction, as described above.

Figure 16:
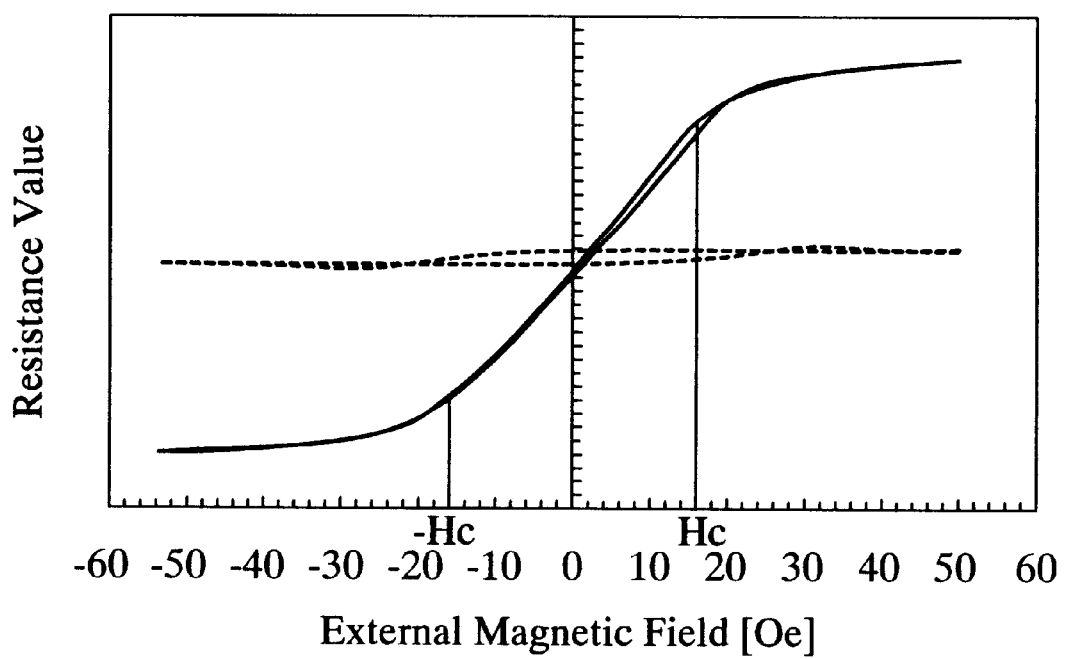
FIG. 16 is a graph showing a resistance change of the GMR element shown in FIG. 12 for the external magnetic field.

The first X axis GMR element 31 thus configured presents a resistance value, which changes in almost proportion to the external magnetic field, that changes along the X axis, within a range of −Hc to +Hc, as indicated by the solid line of FIG. 16, and presents an almost constant value to the external magnetic field that changes along the Y axis, as indicated by the broken line of FIG. 16.

Figure 17:
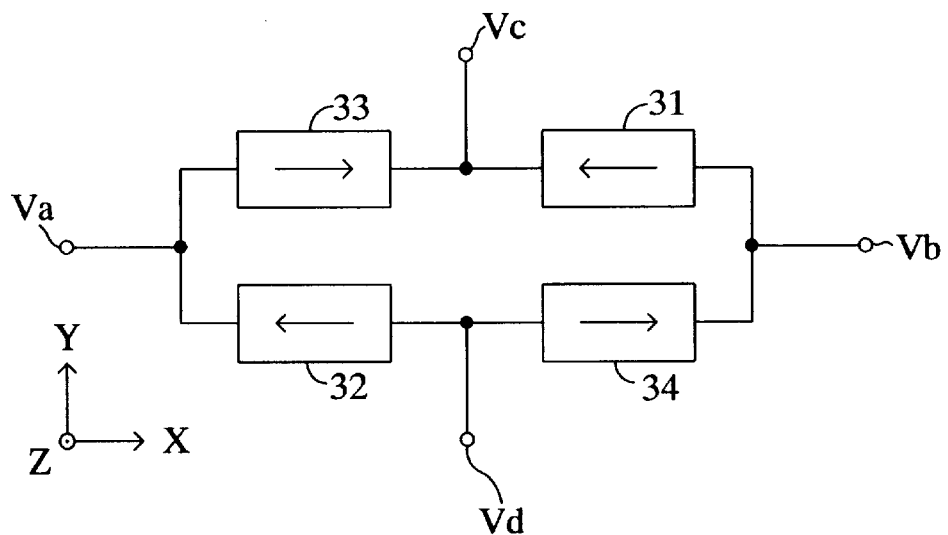
FIG. 17 is an equivalent circuit diagram of an X axis magnetic sensor included in the magnetic sensor shown in FIG. 12.

In this magnetic sensor 30, as shown in FIG. 11, the first to fourth X axis GMR elements 31 to 34 are full-bridge-connected, thereby forming the X axis magnetic sensor for detecting the magnetic field in the X axis direction. In FIG. 17, arrows given in each of the GMR elements 31 to 34 indicate the direction of pinned magnetization of the pin layer (pinned layer) of the GMR elements 31 to 34. In such a structure, a constant potential difference is applied between a connection point Va of the second X axis GMR element 32 and the third X axis GMR element 33, and a connection point Vb of the first X axis GMR element 31 and the fourth X axis GMR element 34. Then, the potential difference (Vc−Vd) between a connection point Vc of the first X axis GMR element 31 and the third X axis GMR element 33, and a connection point Vd of the second X axis GMR element 32 and the fourth X axis GMR element 34 is taken out as a sensor output $V_{out}$.

Figure 18:
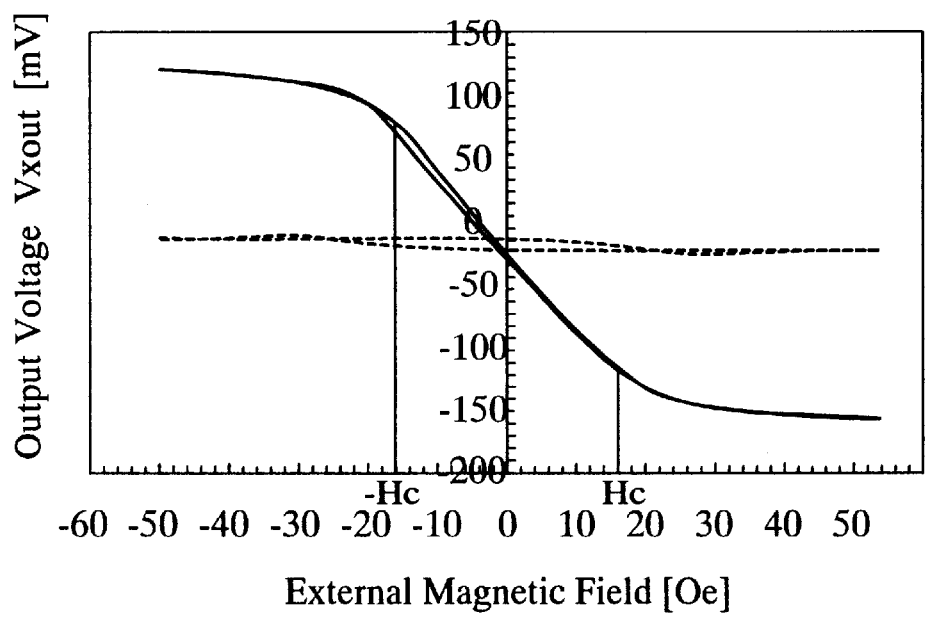
FIG. 18 is a graph showing the change of output voltage (solid line) for the external magnetic field changing in an X axis direction of the X axis magnetic sensor shown in FIG. 17, and the change of output voltage (broken line) for the magnetic field changing in a Y axis direction of the X axis magnetic sensor.

As a result, the X axis magnetic sensor presents an output voltage $V_{xut}$ which varies in almost proportion to the external magnetic field that changes along the X axis within a range of −Hc to +Hc, as indicated by the solid line of FIG. 18, and presents an output voltage of almost "0" to the external magnetic field that changes along the Y axis, as indicated by the broken line of FIG. 18.

The first to fourth Y axis GMR elements 35 to 39 are full-bridge-connected, thereby forming the Y axis magnetic sensor, similarly to the X axis magnetic sensor. The Y axis magnetic sensor presents an output voltage $V_{yout}$ which varies in almost proportion to the external magnetic field that changes along the Y axis within a range of −Hc to +Hc, and presents an output voltage of almost "0" to the external magnetic field that changes along the X axis. As described, the magnetic sensor 30 can detect the external magnetic field without requiring the alternating current bias magnetic field HAC or the like for detecting the external magnetic field, unlike the magnetic sensor 10.

On the other hand, as shown in FIG. 12 and FIG. 13, the free layer F of the narrow zonal portion 31a is given the bias magnetic field in the direction indicated by wide arrows from the bias magnet films 31b . . . 31b, and thus the direction of magnetization of the free layer F is designed to be fixed in a state where the external magnetic field is not applied. However, if a strong external magnetic field is applied, the direction of magnetization of the free layer F can be inverted at a position away from the bias magnet films 31b . . . 31b (i.e., in the vicinity of central part of the Y axis direction in FIG. 12 and FIG. 13), resulting in the change (deterioration) in characteristics of the GMR element.

From the above viewpoint, in the present embodiment, the coils 41 to 48 mentioned above apply the magnetic field for initializing the direction of magnetization of the free layer F. Hereinafter, this point will be described in detail taking the first X axis GMR element 31 and the coil 41 as an example of others. As shown in FIG. 12, the coil 41 is a double spiral type coil having the structure similar to that of the bias magnetic field coil 21 in the first embodiment, and comprises the conductor (i.e., the first conductor 41-1, the second conductor 41-2) forming a pair of spirals. The first X axis GMR elements 31 is disposed between a pair of spiral centers P1 and P2 in a plan view (seen in the Z axis positive direction).

Further, the first conductor 41-1 and the second conductor 41-2 assumes linear (straight) shape and are parallel to each other at a portion that overlaps the first X axis GMR elements 31 in a plan view (i.e., at the portion that passes right under the first X axis GMR elements 31). The electric current flows in the same direction through each conductor in this portion. The longitudinal direction (the long axis ) of each conductor in this portion is perpendicular to the longitudinal direction (the long axis) of the narrow zonal portion 31a in a plan view. The control circuit 51 shown in FIG. 11 applies a potential difference between both ends of the coil 41 under predetermined conditions, for example, before the start of measurement of the external magnetic field, to have a predetermined electric current flow in the coil 41.

That is, the magnetic sensor in this embodiment is a magnetic sensor including the magnetoresistive effect element that includes the free layer and the pin layer such as the GMR element and TMR element, and comprises the bias magnets 31b . . . 31b that are disposed at both ends of the free layer to stabilize the direction of magnetization of the free layer in a state where the external magnetic field is not applied by applying the bias magnetic field in a predetermined direction (direction perpendicular to the direction of the pinned magnetization of the pinned layer) to the free layer; and the initializing coils 41 to 48 which are provided under the free layer (in close vicinity to the free layer) for generating a magnetic field in the same direction as that of the bias magnetic field by being conducted (i.e., by a current flowing) under predetermined conditions (e.g., before the start of magnetic detection) to apply the magnetic field to the free layer.

In such a structure, the coil 41 generates the initializing magnetic field for returning (initializing) the direction of magnetization of the free layer F to a designed direction (direction of bias magnetic field by the bias magnet films 31b . . . 31b). Thus, even if the direction of magnetization of the free layer F is disturbed due to any reason such as strong magnetic field applied to the magnetic sensor (i.e., even if a magnetic domain becomes unstable), it can be corrected. Therefore, the magnetic sensor that is highly reliable is provided.

In this way, in the second embodiment, since the direction of magnetization of the free layer F can be initialized, it Is possible to maintain the initial characteristics of the GMR element. Further, since the coils 41 to 48 are the double spiral type coils, the magnetic sensor 30 can be miniaturized owing to the small occupancy area of the coils, and it is possible to lower the power consumption for the initialization. Also, in the second embodiment, each of the coils 41 to 48 is provided with the control circuits 51 to 58 that apply the electric current to the coils 41 to 48, respectively, for generating the initializing magnetic field. Therefore, the overall length of an electric connection path can be shortened as compared with the case where each of the coils 41 to 48 is connected in series to share one control circuit which gives an electric current to these coils. Thus, the second embodiment can reduce the resistance value of the entire circuits to decrease the power consumption.

Figure 19:
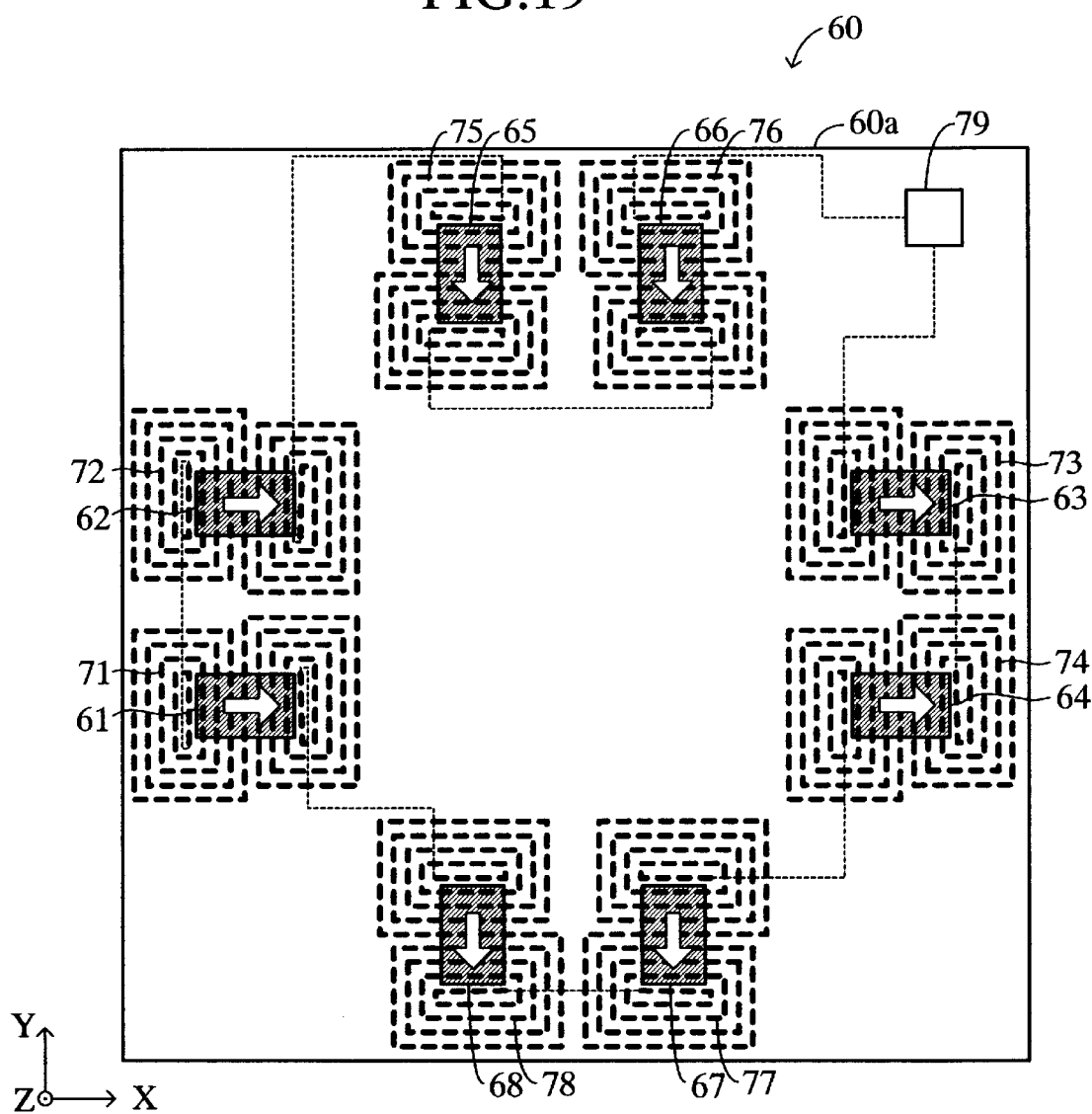
FIG. 19 is a schematic plan view of the magnetic sensor in accordance with a third embodiment of the present invention.

Next, a third embodiment of the magnetic sensor in accordance with the present invention will be described. FIG. 19 is a plan view of a magnetic sensor 60 in accordance with the third embodiment. This magnetic sensor 60 is different from the magnetic sensor 30 according to the second embodiment in terms of the direction of coils 71 to 78 and the way of connection of the coils 71 to 78. In addition, the coils 71 to 78 of the magnetic sensor 60 are different from the coils 41 to 48 of the magnetic sensor 30 in that the coils 71 to 78 generate a testing magnetic field for determining whether each GMR element functions normally (whether or not it detects the external magnetic field normally), whereas the coils 41 to 48 of the magnetic,sensor 30 generate the initializing magnetic field.

More concretely, the magnetic sensor 60 comprises on a substrate 60a eight GMR elements 61 to 68, the eight coils 71 to 78 that are formed under each of the GMR elements 61 to 68, respectively, and that are formed in a plane parallel to each planar film surface of the GMR elements 61 to 68, and one control circuit 79.

The GMR elements 61 to 68 are the same as the GMR elements 31 to 38 in the second embodiment in terms of the position and structure with respect to the substrate. That is, the GMR elements 61 to 64 are bridge-connected to constitute the X axis magnetic sensor for detecting the magnetic field in the X axis direction, and the GMR elements 65 to 68 are similarly bridge-connected to constitute the Y axis magnetic sensor for detecting the magnetic field In the Y axis direction. Further, each of the GMR elements 61 to 68 is connected to a detection circuit (control LSI for magnetic field detection) not shown, which detects the resistance values presented by the GMR elements 61 to 68.

The coils 71 to 78 are the double spiral type coils, similar to the coils 21 and 22 in the first embodiment and the coils 41 to 48 in the second embodiment. As indicated by the wide arrows of FIG. 19, the coils 71 to 74 are formed to generate the magnetic field in the X axis positive direction in the vicinity of line segments between each of spiral centers, and the coils 75 to 78 are formed to generate the magnetic field in the Y axis negative direction In the vicinity of line segments between each of spiral centers. One end of the control circuit 79 and one end of the coil 76 are connected. The coils 76, 75, 72, 71, 78, 77, 74 and 73 are connected in series in this order, and at the end, one of ends of the coil 73 that is not connected to the coil 74 is connected to the other end of the control circuit 79. Further, the GMR elements 61 to 68 are disposed between each corresponding pair of spiral centers of the coils 71 to 78 in a plan view, similarly to those in the first and second embodiments.

In such a structure, when predetermined conditions are satisfied such as when the starting time of detecting the external magnetic field by the magnetic sensor 60 comes, the control circuit 79 generates the potential difference between both the ends, to have an electric current flow through the coils 71 to 78, so that the coils 71 to 78 apply the magnetic field for testing to the GMR elements 61 to 68, respectively. The magnetic sensor 60 monitors the output of each of the GMR elements 61 to 68 in this state with the detection circuit not shown, and determines whether or not the GMR elements 61 to 68 are abnormal on the basis of whether the expected output has been detected The determination of whether an abnormality is occurring is performed as to, for example, whether an open failure is occurring in each of the GMR elements 61 to 68, whether a short (short circuit) failure is occurring, whether sensitivity is insufficient, and whether control transistor is functioning properly.

As described above, in the third embodiment, since it is possible to generate the magnetic field for determining whether an abnormality is occurring in each of the GMR elements 61 to 68, the magnetic sensor 60 can perform a self-diagnosis. In addition, since each of the coils 71 to 78 is double spiral type coil, miniaturization of the magnetic sensor 60 can be attained owing to the small occupancy area of the coils, and it is possible to lower the power consumption for generating the testing magnetic field. Further, since each of the coils 71 to 78 is connected in series and one control circuit 79 applies the electric current at the same time to each of the coils 71 to 78, the testing magnetic field of the same magnitude can be generated for each of the GMR elements 61 to 68, and therefore it becomes possible to more accurately determine whether an abnormality is occurring in each of the GMR elements 61 to 68.

Further, if the detection circuit has a function of selecting one of the GMR elements 61 to 68 independently, it is possible to easily detect whether an abnormality is occurring in the selecting function. This is because, for example, if the selecting function of the detection circuit is abnormal, the output in accordance with the magnetic field in the Y axis direction is obtained when the GMR element for detecting the magnetic field in the X axis direction is selected since the testing magnetic field is given to all the GMR elements 61 to 68 at the same time.

Figure 20:
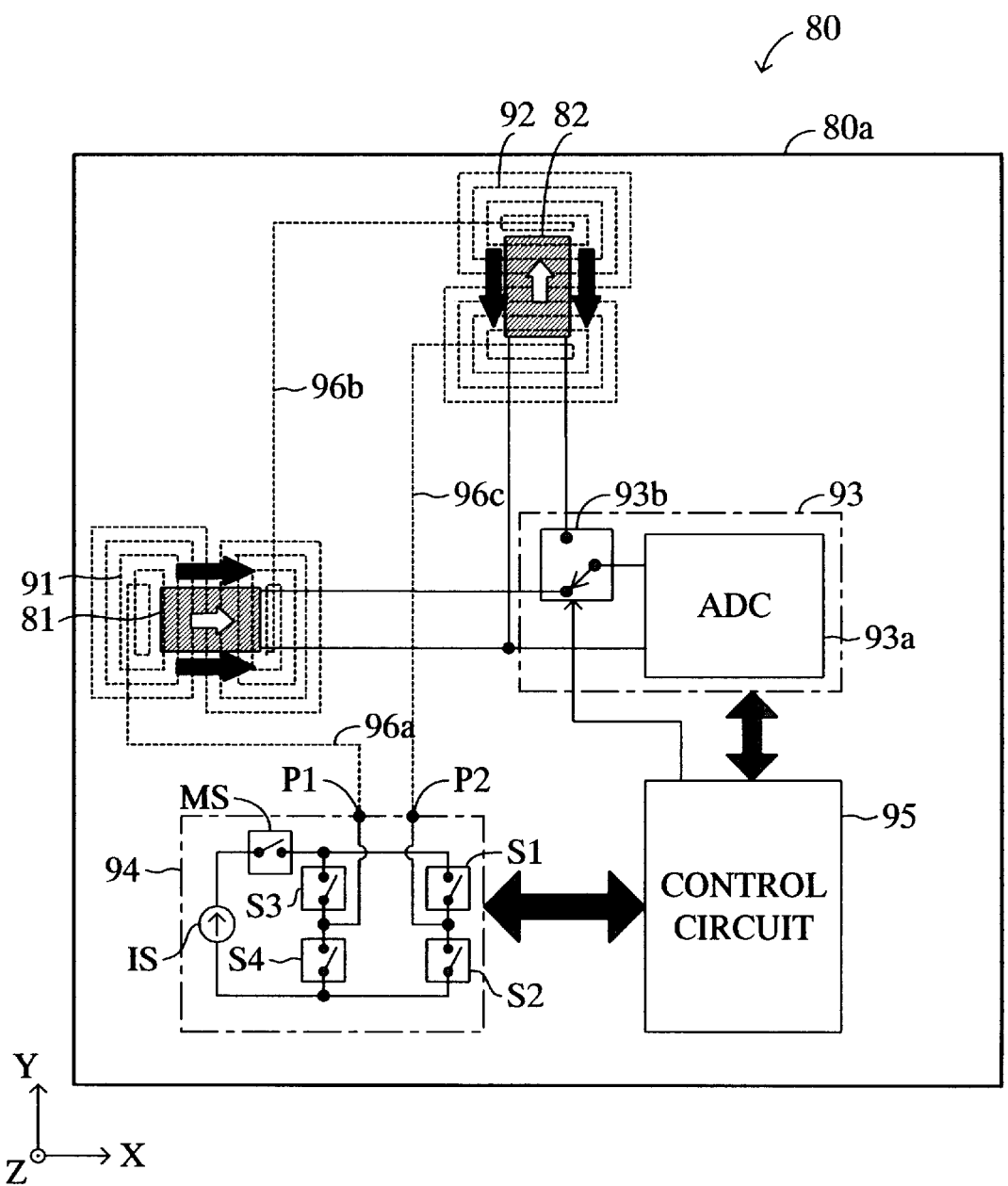
FIG. 20 is a schematic plan view of the magnetic sensor in accordance with a fourth embodiment of the present invention.

Next, a fourth embodiment of the magnetic sensor in accordance with the present invention will be described. FIG. 20 is a plan view of a magnetic sensor 80 in accordance with the fourth embodiment. This magnetic sensor 80 comprises two TMR elements 81 and 82 formed on a substrate 80a, and two testing coils 91 and 92 formed in the substrate 80a under each of the TMR elements 81 and 82 and In a plane parallel to each planar film surface of the TMR elements 81 and 82. The magnetic sensor 80 comprises a detection circuit 93, an electric current supply circuit 94, and a control circuit 95, which are each formed on the substrate 80a.

The TMR element 81 constituting a first magnetic detection portion (X axis magnetic detection unit) comprises the same film structure as that of the TMR element described in the first embodiment (see FIG. 3 and FIG. 4.). It should be noted that the direction of magnetization of the pinned layer of the TMR element 81 is parallel with the X axis negative direction. The magnetization of the pinned layer of the TMR element 81 is firmly fixed (pinned) so that the direction of the magnetization is not changed by the external magnetic field to be detected. Further, in the free layer of the TMR element 81, the direction and magnitude of magnetization change linearly in accordance with the direction and magnitude of the component in the X axis direction of the magnetic field to be detected.

Figure 21:
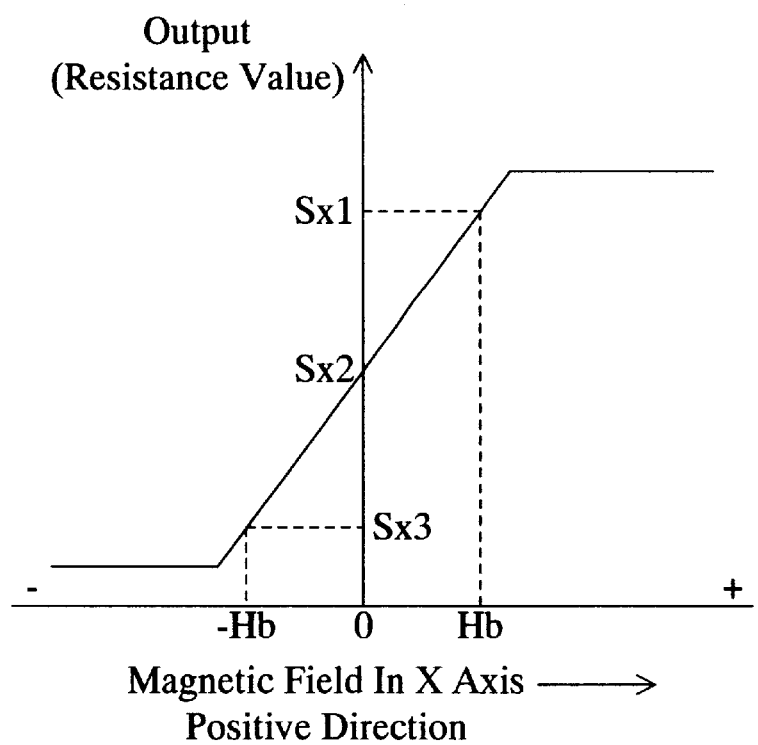
FIG. 21 is a graph showing resistance value characteristics of a TMR element of a first magnetic detection portion (unit) shown in FIG. 20.

Accordingly, the TMR element 81 has the direction of detection indicated by an outline arrow in FIG. 20. That is, as shown in FIG. 21, the TMR element 81 presents a resistance value (physical quantity) which becomes larger as the magnitude of a magnetic field in a first direction (i.e., X axis positive direction) in a first orientation (i.e., X axis direction) becomes larger (i.e., increases) within a range up to a predetermined value, and presents a resistance value (the physical quantity) which becomes smaller (i.e., decreases) as the magnitude of a magnetic field in the opposite direction to the first direction (i.e., in X axis negative direction) in the first orientation becomes larger (i.e., increases) within a range up to a predetermined value.

Furthermore, the TMR element 81, if its characteristics are normal, presents a resistance value Sx1 of a first magnitude when the magnetic field of a predetermined magnitude Hb is applied in the first direction (i.e., in X axis positive direction) in the first orientation from the first testing coil 91, and presents a resistance value Sx2 when the magnetic field is not applied from the first testing coil 91, and presents a resistance value Sx3 of a second magnitude when the magnetic field of the predetermined magnitude Hb is applied in the opposite direction to the first direction (i.e., in X axis negative direction) in the first orientation from the first testing coil 91.

The TMR element 82 constituting a second magnetic detection portion (Y axis magnetic detection unit) comprises the same film structure as that of the TMR element 81. The direction of magnetization of the pinned layer of the TMR element 82 is parallel with the Y axis negative direction.

The magnetization of the pinned layer of the TMR element 82 is firmly fixed (pinned) so that the direction of the magnetization is not changed by the external magnetic field to be detected. Further, in the free layer of the TMR element 82, the direction and magnitude of magnetization change linearly in accordance with the direction and magnitude of the component in the Y axis direction of the magnetic field to be detected.

Figure 22:
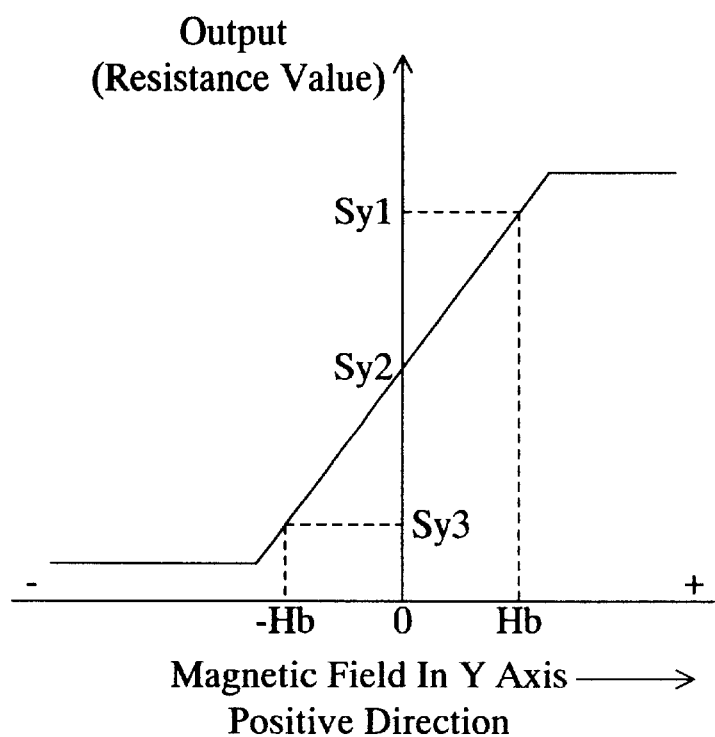
FIG. 22 is a graph showing resistance value characteristics of the TMR element of a second magnetic detection portion (unit) shown in FIG. 20.

Accordingly, the TMR element 82 has the direction of detection indicated by an outline arrow in FIG. 20. That is, as shown in FIG. 22, the TMR element 82 presents a resistance value (physical quantity) which becomes larger as the magnitude of a magnetic field in a second direction (i.e., in Y axis positive direction) in a second orientation (i.e., Y axis direction) crossing (in this case, perpendicular to) the first orientation (i.e., X axis direction) becomes larger (increases) within a range up to a predetermined value, and presents a resistance value (the physical quantity) which becomes smaller as the magnitude of a magnetic field in the opposite direction to the second direction (i.e., in Y axis negative direction) in the second orientation becomes larger within a range up to a predetermined value.

Furthermore, the TMR element 8Z, if its characteristics are normal, presents a resistance value Sy1 which is the same magnitude as that of the resistance value Sx1, which is the physical quantity of the first magnitude when the magnetic field of the predetermined magnitude Hb is applied in the second direction (i.e., Y axis positive direction) in the second orientation from the second testing coil 92, and presents a resistance value Sy2 which is the same magnitude as that of the resistance value Sx2 when the magnetic field is not applied from the second testing coil 92, and presents a resistance value Sy3 which is the same magnitude as that of the resistance value Sx3, which is the physical quantity of the second magnitude, when the magnetic field of the predetermined magnitude Hb is applied in the opposite direction to the second direction (i.e, in Y axis negative direction) in the second orientation from the second testing coil 92.

The first testing coil 91 is the double spiral type coil formed in the same manner as the coil 22 of the magnetic sensor 10, and one end thereof Is connected to one terminal P1 of the electric current supply circuit 94 via a connection conductor 96a, and the other end thereof is connected to one terminal of the second testing coil 92 via a connection conductor 9b, thereby applying the magnetic field whose direction and magnitude change in the X axis direction to the TMR element 81. The second testing coil 92 is the double spiral type coil formed in the same manner as the coil 22 of the magnetic sensor 10, and the other end thereof is connected to the other terminal P2 of the electric current supply circuit 94 via a connection conductor 96c, thereby applying the magnetic field whose direction and magnitude change in the Y axis direction to the TMR element 82.

As described above, since the first testing coil 91 and the second testing coil 92 are connected in series to the electric current supply circuit 94 via the connection conductors 96a to 96c, the electric current having the same magnitude (the same current) is flow through both the first testing coil 91 and the second testing coil 92. Further, as indicated by a black arrow in FIG. 20, when an electric current of a predetermined magnitude in a predetermined direction is made flow thorough the first testing coil 91, the first testing coil 91 applies the magnetic field of the predetermined magnitude Hb in the X axis positive direction to the TMR element 81, and the second testing coil 92 applies the magnetic field of the predetermined magnitude Hb in the Y axis negative direction to the TMR element 82: and when an electric current of the predetermined magnitude in the opposite direction to the predetermined direction is made flow through the first testing coil 91, the first testing coil 91 applies the magnetic field of the predetermined magnitude Hb in the X axis negative direction to the TMR element 81, and the second testing coil 92 applies the magnetic field of the predetermined magnitude Hb in the Y axis positive direction to the TMR element 82.

The detection circuit 93 selects either the TMR element 81 or the TMR element 82, and detects the resistance value of the selected TMR element as a digital value. The detection circuit 93 comprises an analog-digital converter 93a (hereinafter referred to as "ADC 93a".), which is a circuit for outputting the detected digital value to the control circuit 95 and has one channel, and a switching element 93b actually being a transistor.

One input terminal of the ADC 93a is connected to each one end of both the TMR element 81 and the TMR element 82, and the other input terminal is connected to a fixed terminal of the switching element 93b. The switching element 93b inputs an instruction signal from the control circuit 95 to connect the fixed terminal to either the other end of the TMR element 81 or the other end of the TMR element 82, whereby the ADC 93a selects an element whose resistance value, which is the output of the selected element, is analog-to-digital converted.

The electric current supply circuit 94 comprises a switching element MS, switching elements S1 to S4 constituting an electric current direction switching circuit (the switching element MS and the switching elements S1 to S4 constitute a conduction control circuit.), and a constant current source (electric current supply source) IS for supplying a constant current. The switching elements MS and S1 to S4 are actually transistors, and each of them is switched to an "ON" state (conductive state) or an "OFF" state (unconductive state) in accordance with the instruction signal from the control circuit 95.

The switching element MS functions as what is called a main switch, and one end thereof is connected to an output side of the constant current source IS, and the other end is connected to each one end of the switching elements S1 and S3 of the electric current direction switching circuit. The other end of the switching element S1 is connected to one end of the switching element S2, and the other end of the switching element S2 is connected to the other end of the constant current source IS. Similarly, the other end of the switching element 53 is connected to one end of the switching element S4, and the other end of the switching element S4 is connected to the other end of the constant current source IS. Further, the terminal P1 of the electric current supply circuit 94, to which the first testing coil 91 is connected, is connected between the switching elements S3 and S4, and the terminal P2 of the electric current supply circuit 94, to which the second testing coil 92 is connected, is connected between the switching elements S1 and S2.

The control circuit 95, in an ordinary state, sends out an instruction signal to the switching elements MS and S1 to S4 for setting the switching element MS, and the switching elements S1 to 64 of the electric current direction switching circuit into an "OFF" state, and provides an instruction signal to the switching element 93b every time a predetermined time elapses to select the TMR element whose resistance value is subjected to analog-to-digital conversion by the ADC 93a, and then obtains the analog-to-digital converted resistance value of either the TMR element 81 or 82 as a digital value.

Furthermore, when predetermined conditions (conditions to start the test or the diagnosis) are satisfied, for example, a switch not shown is closed, the control circuit 95 supplies an instruction signal to the main switch MS for changing a state of the switching element MS into the "ON" state, and also supplies to the switching elements S1 to S4 an instruction signal for changing a state of the switching elements S1 and 64 of the electric current direction switching circuit into the "ON" state and for changing a state of the switching elements S3 and S2 into the "OFF" state, or an instruction signal for changing a state of the switching elements S3 and S2 of the electric current direction switching circuit into the "ON" state and changing a state of the switching elements SI and S4 into the "OFF" state.

Next, the operation of the magnetic sensor 80 configured as above will be described. As described above, because the switching element MS, and the switching elements S1 to S4 of the electric current direction switching circuit are ordinarily in the "OFF" state, the first and second testing coils 91 and 92 do not generate any magnetic field. Further, because the switching element 93b is switched every time the predetermined time elapses, the resistance value indicated by the TMR elements 81 or the resistance value indicated by the TMR elements 82 is converted (detected) into a digital value by the ADC 93a. The converted value is used to detect terrestrial magnetism or the like by the circuit.

Next, the operation when the magnetic sensor 80 is tested after the predetermined conditions are satisfied will be described. In this magnetic sensor 80, a determination is made whether the first and second testing coils 91 and 92 generate the expected testing magnetic field (i.e., whether the detection circuit 93 and the electric current supply circuit 94 function normally), in addition to the test for the characteristics fault of the TMR elements 81 and 82 (i.e., testing whether the sensitivity is excessively low. whether the hysteresis is excessively large). Hereinafter, the procedure of such examinations will be described taking for example the case where all the TMR elements 81 and 82, the detection circuit 93, and the electric current supply circuit 94 of the magnetic sensor 80 function properly. (First Procedure)

The control circuit 95 first provides to each corresponding element an instruction signal for changing the state of the main switch MS into the "ON" state, an instruction signal for changing the state of the switching elements S1 and S4 of the electric current direction switching circuit into the "ON" state and changing the state of the switching elements S3 and S2 into the "OFF" state, and an instruction signal for the switching element 93b to select the TMR element 81.

In this case, because all functions properly, the switching element MS is switched to the "ON" state, the switching elements S1 and S4 of the electric current direction switching circuit turns into ON- state, and the switching elements S3 and S2 turns into the "OFF" state. Thus, the electric current of the constant current supply IS passes through the switching element MS, the switching element S1, the second testing coil 92, the first testing coil 91, the switching element S4 and the constant current supply IS in order. In this specification, this state is also called a state where an instructed current applied to the first and second testing coils is made a positive current having a predetermined magnitude.

In this case, the second testing coil 92 applies the magnetic field of the magnitude Hb in the Y axis negative direction to the TMR element 82, and the first testing coil 91 applies the magnetic field of the magnitude Hb in the X axis positive direction to the TMR element 81. Under this condition, the TMR element 81 presents resistance of a resistance value Sx1, and the ADC 93a converts the resistance value of the TMR element 81 into a digital value. Therefore, as shown in (A) of FIG. 23, the control circuit 95 obtains the resistance value Sx1 as a value X1 from the ADC 93a.

Second Procedure

Next, the control circuit 95 provides an instruction signal to the switching element MS for changing the state of the switching element MS into the "OFF" state. As a result, since the switching element MS is switched from the "ON" state to the "OFF" state, the first testing coil 91 and the second testing coil 92 are in an unconductive state. Thus, the electric current from the constant current supply IS is shut off. Therefore, the first and second testing coils 91 and 92 do not generate any magnetic field.

Under this condition, the TMR element 81 presents resistance of a resistance value Sx2, and the ADC 93a converts the resistance value of the TMR element 81 Into a digital value. Therefore, as shown in (A) of FIG. 23, the control circuit 95 obtains the resistance value Sx2 that is smaller than the resistance value Sx1 as a value X2 from the ADC 93a.

Third Procedure

Next, the control circuit 95 provides to each corresponding element an instruction signal for changing the state of the main switch MS into the "ON" state again, an instruction signal for changing the state of the switching elements SI and S4 of the electric current direction switching circuit into the "OFF" state and an instruction signal for changing the state of the switching elements S3 and S2 into the "ON" state.

As a result, the switching element MS is switched to the "ON" state, the switching elements S1 and S4 of the electric current direction switching circuit turn into the "OFF" state, and the switching elements S3 and S2 turn into the "ON" state. Thus, the electric current of the constant current supply IS passes through the switching element MS, the switching element S3, the first testing coil 91, the second testing coil 92, the switching element 52 and the constant current supply IS in order. In this specification, this state is also called a state where the instructed current applied to the first and second testing coils is a negative current having the predetermined magnitude.

As a result, the first testing coil 91 applies the magnetic field of the magnitude Hb in the X axis negative direction to the TMR element 81, and the second testing coil 92 applies the magnetic field of the magnitude Hb in the Y axis positive direction to the TMR element 82. Under this condition, the TMR element 81 presents resistance of a resistance value Sx3, and the ADC 93a converts the resistance value of the TMR element 81 into a digital value.

Figure 23:
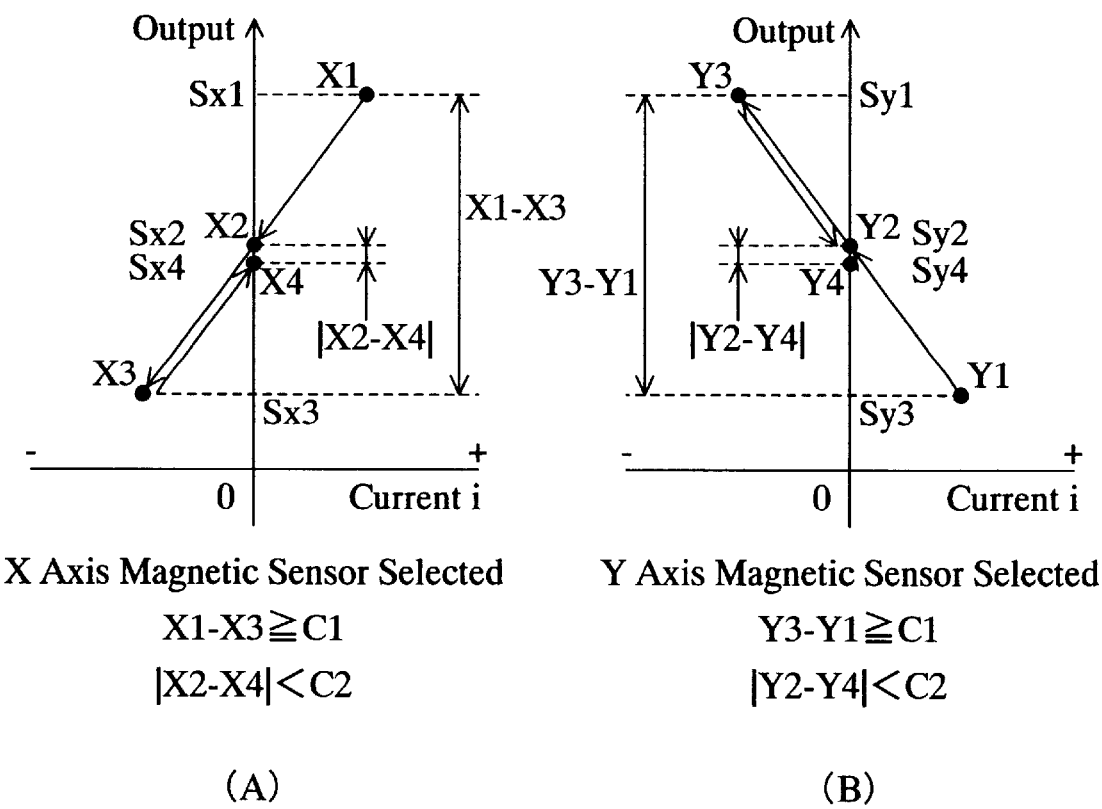
FIG. 23 shows graphs illustrating detection values obtained by a control circuit when the magnetic sensor shown in FIG. 20 is normal.

Therefore, as shown in (A) of FIG. 23, the control circuit 95 obtains the resistance value Sx3 as a value X3 from the ADC 93a.

Fourth Procedure

Next, the control circuit 95 provides an instruction signal to the switching element MS for changing the state of the switching element MS into the "OFF" state . As a result, since the switching element MS is switched from the "ON" state to the "OFF" state, the first testing coil 91 and the second testing coil 92 are in an unconductive state. Thus, the electric current from the constant current supply IS is shut off. Therefore, the first and second testing coils 91 and 92 do not generate any magnetic field.

Under this condition, the TMR element 81 presents resistance of a resistance value Sx4 close to the resistance value Sx2, and the ADC 93a converts the resistance value of the TMR element 81 into a digital value. Therefore, as shown in (A) of FIG. 23, the control circuit 95 obtains the resistance value Sx4 as a value X4 from the ADC 93a.

Fifth Procedure

Next, the control circuit 95 provides to each corresponding element an instruction signal for changing the state of the main switch MS into the "ON" state, an instruction signal for changing the state of the switching elements S1 and S4 of the electric current direction switching circuit into the "ON" state, an instruction signal for changing the state of the switching elements S3 and S2 into the "OFF" state, and an instruction signal for the switching element 93b to select the TMR element 82.

Thus, the electric current of the constant current supply IS passes through the switching element MS, the switching element S1, the second testing coil 92, the first testing coil 91, the switching element S4 and the constant current supply IS in order. As a result, since the second testing coil 92 applies the magnetic field of the magnitude Hb in the Y axis negative direction to the TMR element 82, the TMR element 82 presents resistance of a resistance value Sy3, and the ADC 93a converts the resistance value of the TMR element 82 into a digital value. Therefore, as shown in (B) of FIG. 23, the control circuit 95 obtains the resistance value Sy3 as a value Y1 from the ADC 93a.

Sixth Procedure

Next, the control circuit 95 provides an instruction signal to the switching element MS for changing the state of the switching element MS into the "OFF" state. As a result, since the switching element MS is switched from the "ON" state to the "OFF" state, the first testing coil 91 and the second testing coil 92 are in an unconductive state. Thus, the electric current from the constant current supply IS is shut off. Therefore, the first and second testing coils 91 and 92 do not generate any magnetic field.

Under this condition, since the ADC 93a converts the resistance value of the TMR element 82 into a digital value, as shown in (B) of FIG. 23, the control circuit 95 obtains the resistance value Sy2 that is larger than the resistance value Sy3 as a value Y2 from the ADC 93a.

Seventh Procedure

Next, the control circuit 95 provides to each corresponding element an instruction signal for changing the state of the main switch MS into the "ON" state again, an instruction signal for changing the state of the switching elements s1 and S4 of the electric current direction switching circuit into the "OFF" state, an instruction signal for changing the state of the switching elements S3 and S2 into the "ON" state.

As a result, the switching element MS is switched to the "ON" state, the switching elements S1 and S4 of the electric current direction switching circuit turn Into the "OFF" state, and the switching elements S3 and S2 turn into the "ON" state. Under this condition, the second testing coil 92 applies the magnetic field of the magnitude Hb in the Y axis positive direction to the TMR element 82. At this point, the TMR element 82 presents resistance of a resistance value Sy1, and the ADC 93a converts the resistance value of the TMR element 82 into a digital value. Therefore, as shown in (B) of FIG. 23, the control circuit 95 obtains the resistance value Sy1 as a value Y3 from the ADC 93a.

Eighth Procedure

Next, the control circuit 95 provides an instruction signal to the switching element MS for changing the state of the switching element MS into the "OFF" state. As a result, since the switching element MS is switched from the "ON" state to the "OFF" state, the first testing coil 91 and the second testing coil 92 are in an unconductive state. Thus, the electric current from the constant current supply IS is shut off. Therefore, the first and second testing coils 91 and 92 do not generate any magnetic field.

Under this condition, the TMR element 82 presents resistance of a resistance value Sy4 close to the resistance value Sy2, and the ADC 93a converts the resistance value of the TMR element 82 into a digital value. Therefore, as shown in (B) of FIG. 23, the control circuit 95 obtains the resistance value Sy4 as a value Y4 from the ADC 93a. (Ninth Procedure: Abnormality Determination Step)

The control circuit 95 obtains the values X1 to X4, and values Y1 to Y4 during the first to eighth procedures above, and then determines whether the following Equation 3 to Equation 6 are satisfied.

$$X1-X3 \geq C1 \quad \text{[Equation 3]}$$

$$|X2-X4| < C2 \quad \text{[Equation 4]}$$

$$Y3-Y1 \geq C1 \quad \text{[Equation 5]}$$

$$|Y2-Y4| < C2 \quad \text{[Equation 6]}$$

The value C1 in Equation 3 and Equation 5 above is selected to be larger than the maximum value of the value (X1−X3) when the sensitivity of the TMR element 81 is insufficient and to be larger than the maximum value of the value (Y3−Y1) when the sensitivity of the TMR element 82 is insufficient. The value C2 in Equation 4 and Equation 6 above is selected to be smaller than the minimum value |X2−X4| when the hysteresis of the TMR element 81 is excessively large and to be smaller than the minimum value |Y2−Y4| when the hysteresis of the TMR element 82 is excessively large. Note that the values C1 and C2 are both positive values.

At the present moment, all of the TMR elements 81 and 82, detection circuit 93, and electric current supply circuit 94 of the magnetic sensor 80 function properly (normally), resulting in X1−X3=Sx1−Sx3≧C1, |X2−X4|=|Sx2−Sx4|<C2, Y3−Y1=Sy3−Sy1 ≧C1, and |Y2−Y4|=|Sy2−Sy4|<C2. That is, Equation 3 to Equation 6 are all satisfied. Therefore, the control circuit 95 determines all of the TMR elements 81 and 82, detection circuit 93, and electric current supply circuit 94 of the magnetic sensor 80 to be normal (i.e., they are operating properly as expected).

Figure 24:
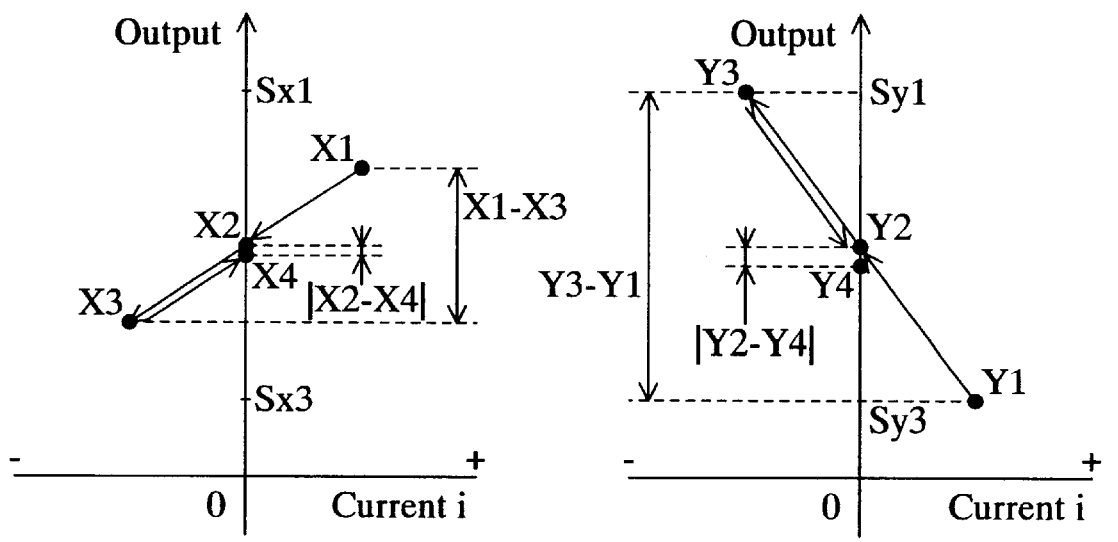
FIG. 24 shows graphs illustrating detection values obtained by the control circuit when the sensitivity of the first magnetic detection portion of the magnetic sensor shown in FIG. 20 is insufficient.

Next, the case where the sensitivity of the TMR element 81 is insufficient and the rest function properly (normally) will be described. In this case, when the magnetic field of the magnitude Hb is applied in the X axis positive direction, the TMR element 81 presents a value smaller than the resistance value Sx1 and larger than the resistance value Sx2, and when the magnetic field of the magnitude Hb is applied in the X axis negative direction, the TMR element 81 presents a value larger than the resistance value Sx3 and smaller than the resistance value Sx2. Consequently, the control circuit 95 obtains the values X1 to X4 shown in (A) of FIG. 24, and the values Y1 to Y4 shown in (B) of FIG. 24, by taking the procedure 1 to procedure 8 above.

In this case, Equations 4 to 6 are satisfied, however, because the sensitivity of the TMR element 81 is insufficient, the value (X1−X3) is small and therefore Equation 3 is not satisfied. On the basis of this result, the control circuit 95 determines that the TMR element 81 has an abnormality of insufficient sensitivity.

Figure 25:
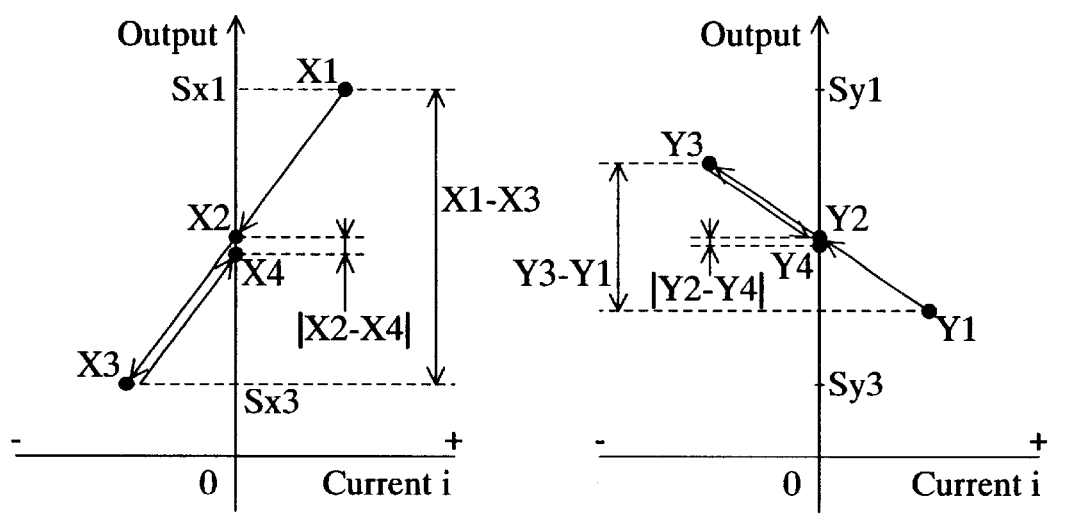
FIG. 25 shows graphs illustrating detection values obtained by the control circuit when the sensitivity of the second magnetic detection portion of the magnetic sensor shown in FIG. 20 is insufficient.

Next, the case where the sensitivity of the TMR element 82 is insufficient and the rest function normally will be described. In this case, when the magnetic field of the magnitude Hb is applied in the Y axis positive direction, the TMR element 82 presents a value smaller than the resistance value Sy1 and larger than the resistance value Sy2, and when the magnetic field of the magnitude Hb is applied in the Y axis negative direction, the TMR element 82 presents a value larger than the resistance value Sy3 and smaller than the resistance value Sy2. Consequently, the control circuit 95 obtains the values X1 to X4 shown in (A) of FIG. 25, and the values Y1 to Y4 shown in (B) of FIG. 25, by taking the procedure 1 to procedure 8 above.

In this case, Equation 3, Equation 4 and Equation 6 are satisfied, however, because the sensitivity of the TMR element 82 is insufficient, the value (Y3−Y1) is small and therefore Equation 5 is not satisfied. On the basis of this result, the control circuit 95 determines that the TMR element 82 has an abnormality of insufficient sensitivity.

Figure 26:
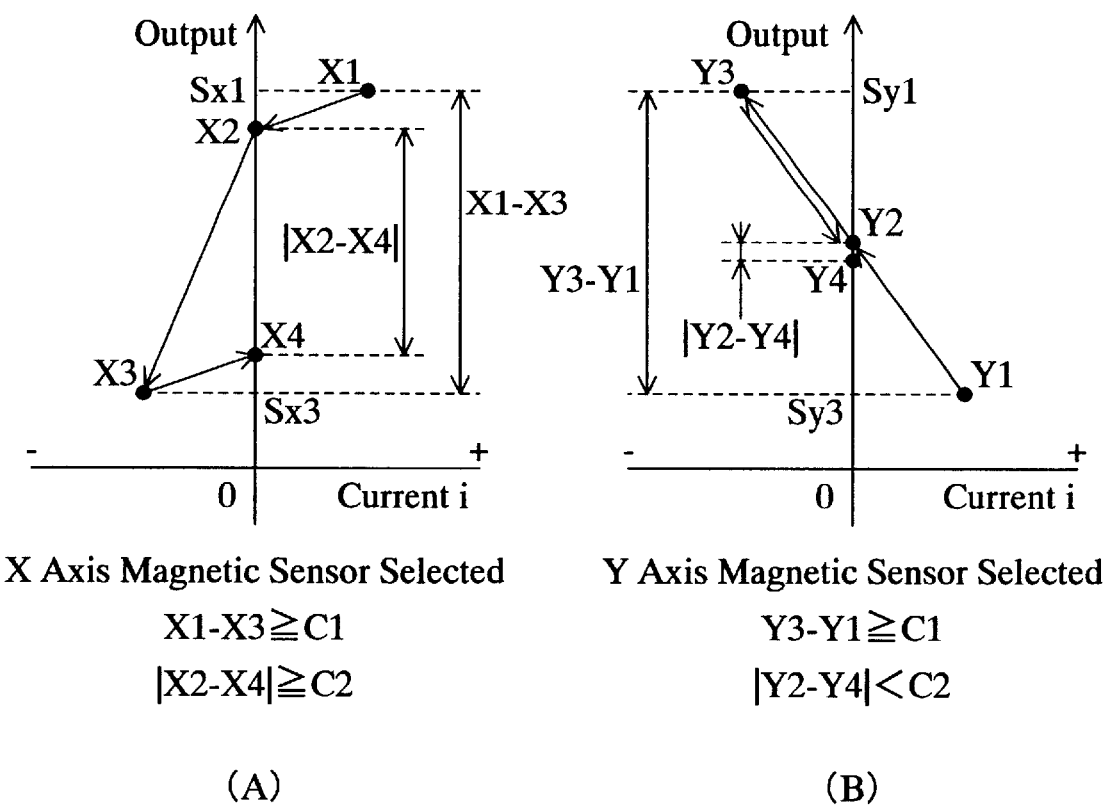
FIG. 26 shows graphs illustrating detection values obtained by the control circuit when the hysteresis of the first magnetic detection portion of the magnetic sensor shown in FIG. 20 is excessive.

Next, the case where the hysteresis of the TMR element 81 is excessively large and the rest function normally will be described. When the magnetic field of the magnitude Hb is applied in the X axis positive direction and then the magnetic field is eliminated, the TMR element 81 presents a value significantly larger than the resistance value Sx2 and smaller than the resistance value Sx1, and when the magnetic field of the magnitude Hb is applied in the X axis negative direction and then the magnetic field is eliminated, the TMR element 81 presents a value significantly smaller than the resistance value Sx2 and larger than the resistance value Sx3. Consequently, the control circuit 95 obtains the values X1 to X4 shown in (A) of FIG. 26, and the values Y1 to Y4 shown in (B) of FIG. 26, by taking the procedure 1 to procedure 8 above.

In this case, Equation 3. Equation 5 and Equation 6 are satisfied, however, because the hysteresis of the TMR element 81 is excessively large, the value |X2−X4| is large and therefore Equation 4 is not satisfied. On the basis of this result, the control circuit 95 determines that the TMR element 81 has an abnormality of excessively large hysteresis.

Figure 27:
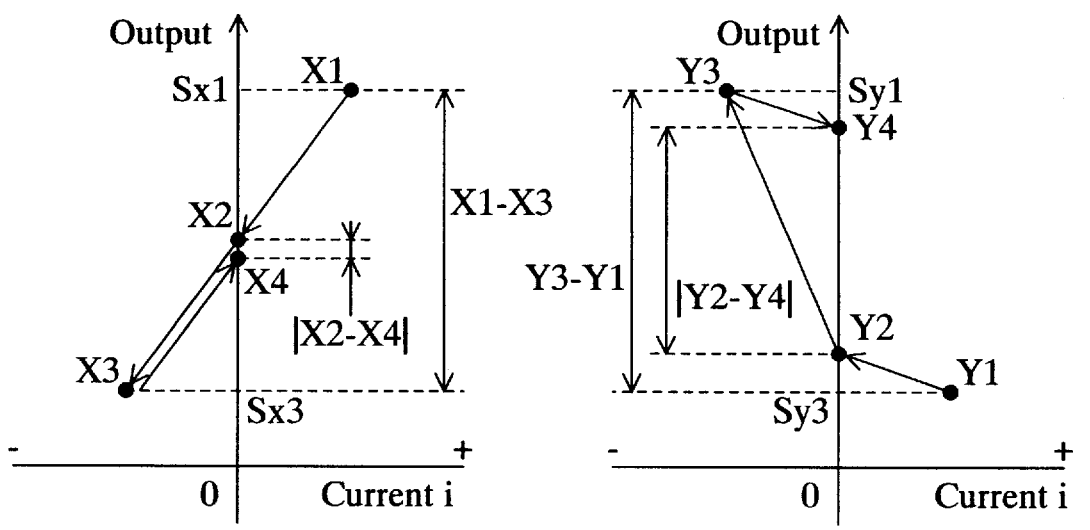
FIG. 27 shows graphs illustrating detection values obtained by the control circuit when the hysteresis of the second magnetic detection portion of the magnetic sensor shown in FIG. 20 is excessive.

Next, the case where the hysteresis of the TMR element 82 is excessively large and the rest function normally will be described. When the magnetic field of the magnitude Hb is applied in the Y axis negative direction and then the magnetic field is eliminated, the TMR element 82 presents a value significantly smaller than the resistance value Sy2 and larger than the resistance value Sy3, and when the magnetic field of the magnitude Hb is applied in the Y axis positive direction and then the magnetic field is eliminated, the TMR element 82 presents a value significantly larger than the resistance value Sy2 and smaller than the resistance value Sy1. Consequently, the control circuit 95 obtains the values X1 to X4 shown in (A) of FIG. 27, and the values Y1 to Y4 shown in (B) of FIG. 27, by taking the procedure 1 to procedure 8 above.

In this case, Equation 3 to Equation 5 are satisfied, however, because the hysteresis of the TMR element 82 is excessively large, the value |Y2−Y4| is large and Equation 6 is not satisfied. On the basis of this result, the control circuit 95 determines that the TMR element 82 has an abnormality of excessively large hysteresis.

Next, a description will be given of the case where an abnormality occurs in which the electric current continues to pass through the first and second testing coils 91 and 92 (however, the direction of the electric current passing through the first and second testing coils 91 and 92 can be changed), while the rest function normally. This case may occur, for example, when the switching element MS functioning as the main switch is always in the "ON" state and does not change into the "OFF" state.

Figure 28:
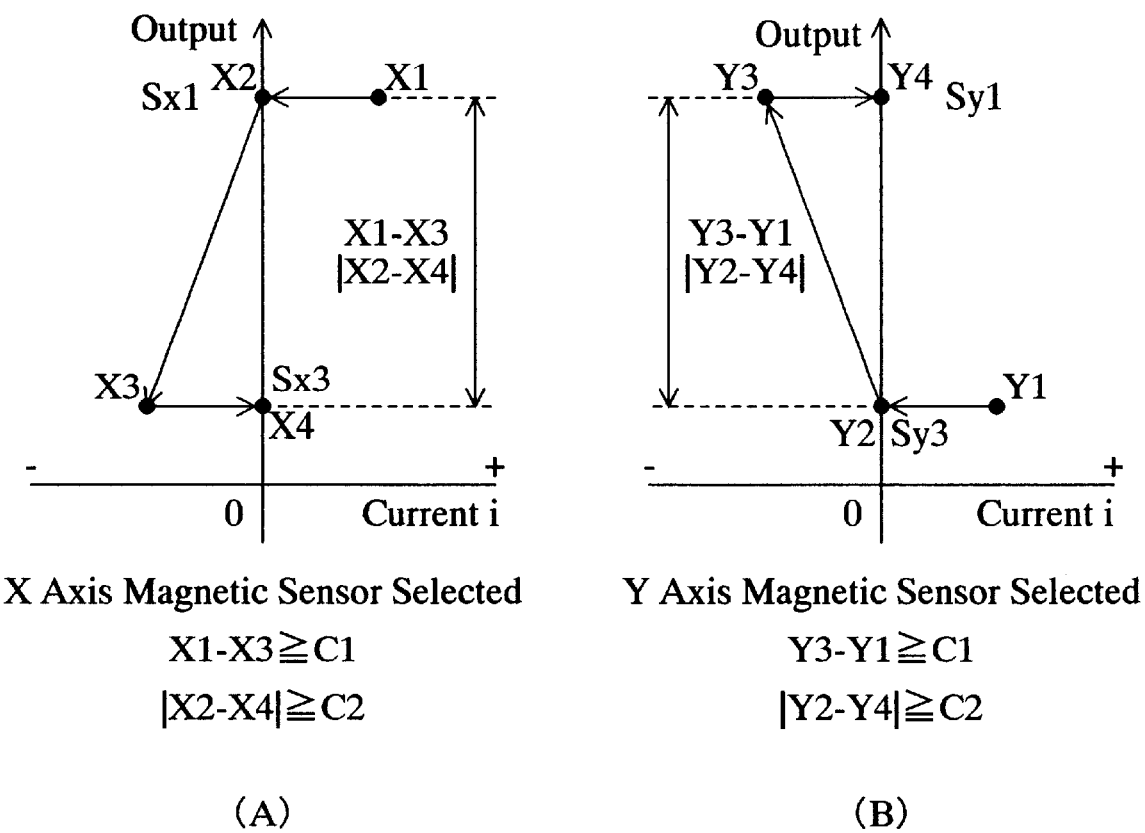
FIG. 28 shows graphs illustrating detection values obtained by the control circuit when an abnormality occurs in which the magnitude of an electric current passing through a testing coil of the magnetic sensor shown in FIG. 20 can not be changed (an electric current for the test can not be shut off)

In this case also, the control circuit performs the procedure 1 to procedure a above. When such an abnormal state occurs, since the magnetic field of the definite magnitude Hb in the X axis positive direction is applied to the TMR element 81 by the first testing coil 91 in the procedure 1 and procedure 2, the TMR element 81 presents the resistance value Sx1. Further, since the magnetic field of the definite magnitude Hb in the X axis negative direction is applied to the TMR element 81 by the first testing coil 91 in the procedure 3 and procedure 4, the TMR element 81 presents the resistance value Sx3. Similarly, since the magnetic field of the definite magnitude Hb in the Y axis negative direction is applied to the TMR element 82 by the second testing coil 92 in the procedure 5 and procedure 6, the TMR element 82 presents the resistance value Sy3. Further, since the magnetic field of the definite magnitude Hb in the Y axis positive direction is applied to the TMR element 82 by the second testing coil 92 in the procedure 7 and procedure 8, the TMR element 82 presents the resistance value Sy1. Consequently, the control circuit 95 obtains the values X1 to X4 shown in (A) of FIG. 28, and the values Y1 to Y4 shown in (B) of FIG. 28.

As a result, Equation 3 and Equation 5 are satisfied, however, since the value X2 becomes the same resistance value Sx1 as the value X1 and the value X4 becomes the same resistance value Sx3 as the value X3, Equation 4 is not satisfied. Similarly, since the value Y2 becomes the same resistance value Sy3 as the value Y1 and the value Y4 becomes the same resistance value Sy1 as the value Y3, Equation 6 is not satisfied. When such a result is obtained, the control circuit 95 determines that an abnormality is occurring in the magnetic sensor 80.

Next, a description will be given of the case where an abnormality occurs in which the electric current can not pass through the first and second testing coils 91 and 92. This case may occur, for example, when the switching element MS functioning as the main switch is always in the "OFF" state and does not change into the "ON" state, when the first and second testing coils 91 and 92 are broken, or when the connection conductors 96a to 96c are broken.

Figure 29:
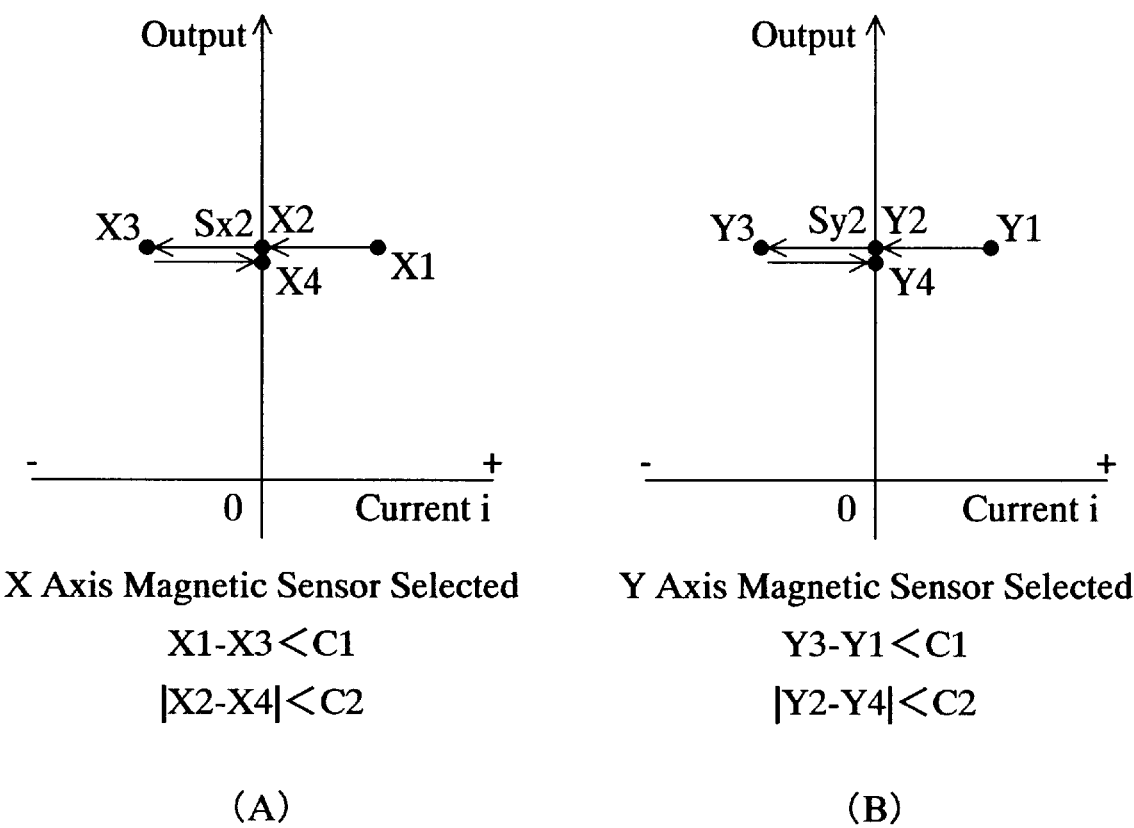
FIG. 29 shows graphs illustrating detection values obtained by the control circuit when an abnormality occurs in which an electric current can not be applied to the testing coil of the magnetic sensor shown in FIG. 20.

In this case, the control circuit also performs the procedure 1 to procedure 8 above. When such an abnormal state occurs, in all of the procedure 1 to procedure 8 above, the first and second testing coils 91 and 92 do not generate any magnetic field. Therefore, all of the values X1 to X4 become equal to the same value which is the resistance value Sx2 as shown in (A) of FIG. 29, and all of the values Y1 to Y4 become equal to the same value which is the resistance value Sy2 as shown in (B) of FIG. 29. Consequently, Equation 4 and Equation 6 are satisfied, however, Equation 3 and Equation 5 are not satisfied. When such a result is obtained, the control circuit 95 determines that an abnormality is occurring in the magnetic sensor 80.

Next, a description will be given of the case where an abnormality occurs in which the direction of the electric current passing through the first and second testing coils 91 and 92 can not be changed. This case may occur, for example, when the switching elements S1 and 94 of the electric current direction switching circuit are always in the "ON" state and do not change into the "OFF" state, and the switching elements S2 and S3 are always in the "OFF" state and do not change into the "ON" state.

In this case, the control circuit also performs the procedure 1 to procedure 8 above. In such an abnormal state, since the electric current of the same magnitude in the same direction passes through the first testing coil 91, the magnetic field of the magnitude Hb in the X axis positive direction is applied to the TMR element 81 in the procedure 1 and procedure 3. Therefore, as indicated by the solid line in (A) of FIG. 30, since the values X1 and X3 obtained by the control circuit 95 become equal to the same resistance value Sx1, Equation 4 is satisfied, however, Equation 3 is not satisfied.

Similarly, since the electric current of the same magnitude in the same direction passes through the second testing coil 92 in the procedure 5 and procedure 7, the magnetic field of the magnitude Hb in the Y axis negative direction is applied to the TMR element 82. Therefore, as indicated by the solid line in (B) of FIG. 30, since the values Y1 and Y3 become equal to the same value Sy3.

Equation 6 is satisfied, however, Equation 5 is not satisfied. When such a result is obtained, the control circuit 95 determines that an abnormality is occurring in the magnetic sensor 80.

Figure 30:
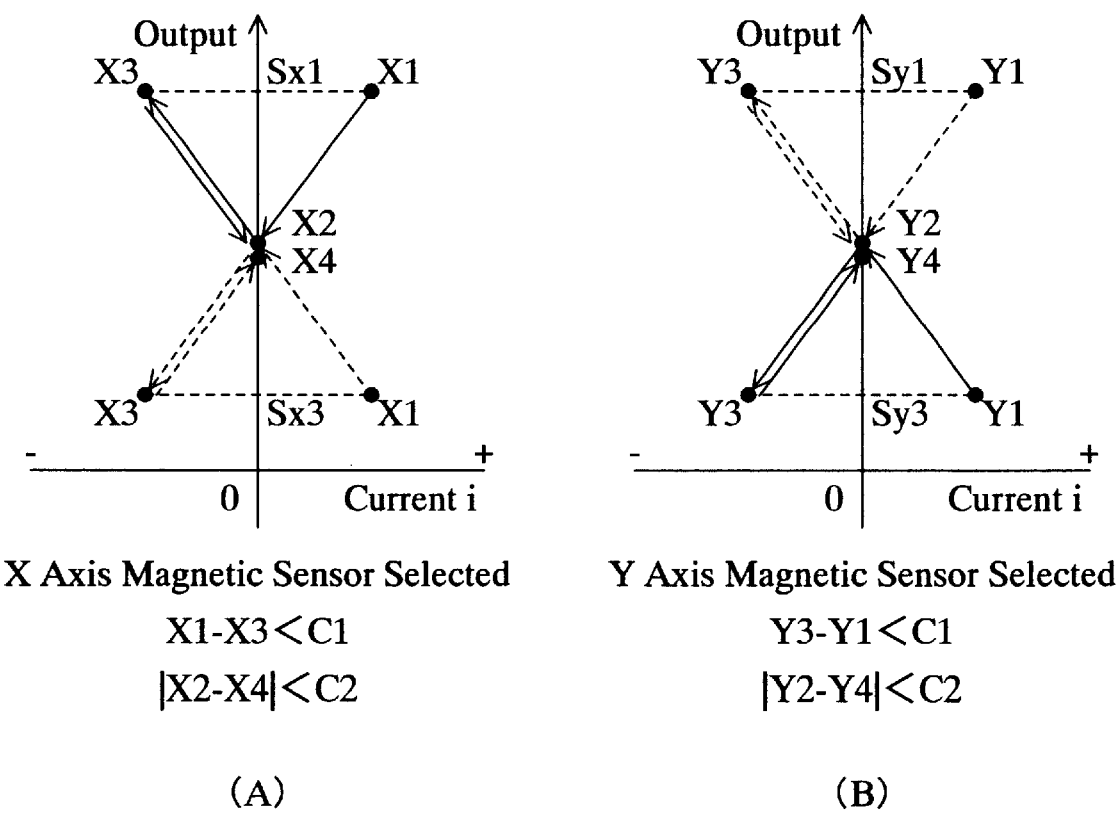
FIG. 30 shows graphs illustrating detection values obtained by the control circuit when an abnormality occurs in which the direction of an electric current passing through the testing coil of the magnetic sensor shown in FIG. 20 can not be changed.

In addition, when the switching elements S3 and S2 of the electric current direction switching circuit are always in the "ON" state and do not change into the "OFF" state, and the switching elements S1 and S4 are always in the "OFF" state and do not change into the "ON" state, as indicated by the broken line in (A) and (B) of FIG. 30, the value X1 and the value X3 become equal to the same resistance value Sx3, and the value Y1 and the value Y3 become equal to the same resistance value Sy1 Thus, Equation 3 and Equation 5 are not satisfied. Therefore, when such a result is obtained, the control circuit 95 also determines that an abnormality is occurring in the magnetic sensor 80.

Next, a description will be given of the case where an abnormality occurs in which the switching element 93b of the detection circuit 93 always selects the TMR element 81 and can not select the TMR element 82.

Figure 31:
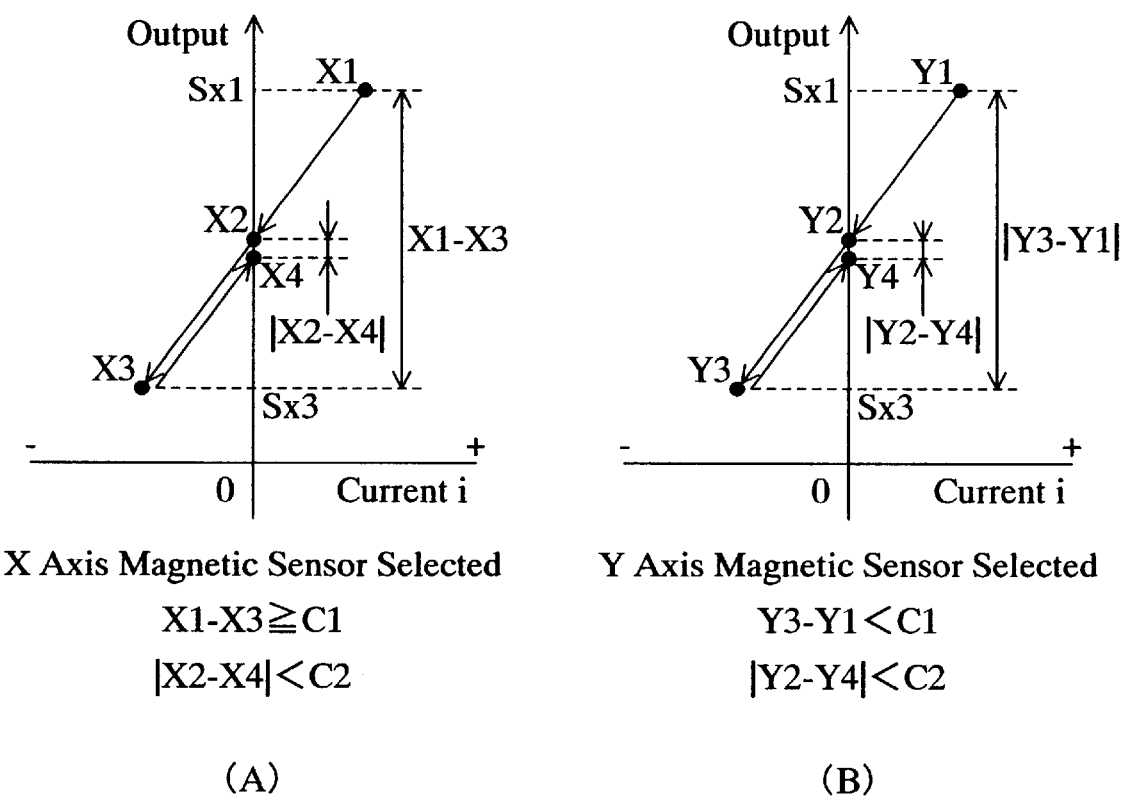
FIG. 31 shows graphs illustrating detection values obtained by the control circuit when an abnormality occurs in which a detection circuit always selects the first magnetic detection portion in the magnetic sensor shown in FIG. 20.

In such an abnormal state, since the resistance value of the TMR element 81 is always detected, each of the results of the procedure 5 to procedure 8 is substantially the same as each of the results of the procedure I to procedure 4, respectively, as shown in (A) and (B) of FIG. 31. Thus each of the value X1 to the value X4 and each of the value Y1 to the value Y4 becomes substantially equal, respectively. That is, since the value Y1 becomes the same resistance value Sx1 as the value X1 and the value Y3 becomes the same resistance value Sx3 as the value X3, the value (Y3−Y1) is the same negative value as the value (X3−X1). Therefore, Equation 3, Equation 4 and Equation 6 are satisfied, however, Equation 5 is not satisfied. When such a result is obtained, the control circuit 95 determines that an abnormality is occurring in the magnetic sensor 80 (i.e., in the detection circuit 93).

Similarly, a description will be given of the case where an abnormality occurs in which the switching element 93b of the detection circuit 93 always selects the TMR element 82 and can not select the TMR element 81.

Figure 32:
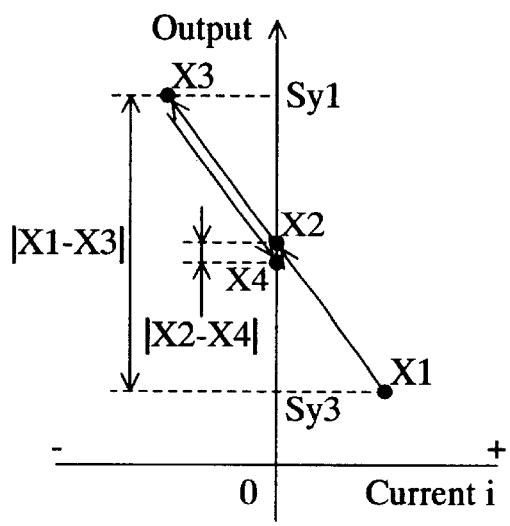
FIGS. 32 shows graphs illustrating detection values obtained by the control circuit when an abnormality occurs in which the detection circuit always selects the second magnetic detection portion in the magnetic sensor shown in FIG. 20.
Figure 32:
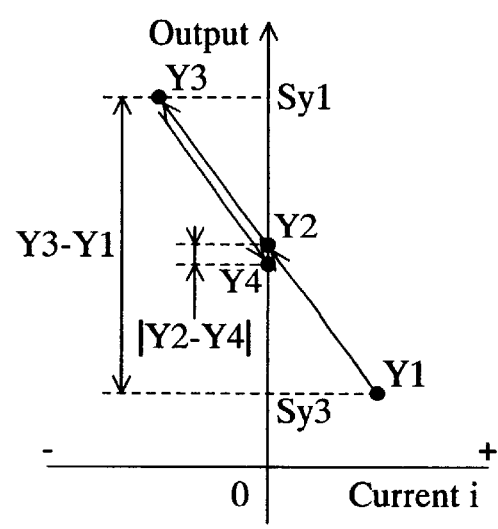

In such an abnormal state, since the resistance value of the TMR element 82 is always detected, each of the results of the procedure 1 to procedure 4 is substantially the same as each of the results of the procedure 5 to procedure 8, respectively, as shown in (A) and (B) of FIG. 32. Thus, each of the value X1 to the value X4 and each of the value Y1 to the value Y4 becomes substantially equal, respectively. That is, since the value X1 becomes the same resistance value Sy3 as the value Y1 and the value X3 becomes the same resistance value Sy1 as the value Y3, the value (X1−X3) is the same negative value as the value (Y1−Y3). Therefore, Equation 4 to Equation 6 are satisfied, however, Equation 3 is not satisfied. When such a result is obtained, the control circuit 95 determines that an abnormality is occurring in the magnetic sensor 80 (i.e., in the detection circuit 93).

Tenth Procedure: Balance Determination Steps

Finally, when the control circuit 95 determines that no abnormalities have been occurring through the procedures so far, the control circuit 95 determines whether the following Equation 7 and Equation 8 are satisfied to determine whether the TMR element 81 and the TMR element 82 are balanced in the characteristics. Note that a value C3 is a positive predetermined value.

$|X1-Y3|<C3$ [Equation 7]

$|X3-Y1|<C3$ [Equation 8]

When either Equation 7 or Equation 8 is not satisfied, the control circuit 95 determines that an abnormality is occurring in which the balance in the outputs of the TMR element 81 and the TMR element 82 is lost, As described above, according to the magnetic sensor 80 in the fourth embodiment, since the first testing coil 91 and the second testing coil 92 are included in a chip (the substrate 80a) and the testing magnetic field can be given to the TMR elements 81 and 82, a testing apparatus for the magnetic sensor 80 does not need to comprise function to generate a magnetic field.

Furthermore, according to the magnetic sensor 80, since the first testing coil 91 and the second testing coil 92 are connected in series to the constant current supply IS being the electric current supply source, and the switching element MS and the switching elements S1 to S4 that function as a conduction control circuit are interposed in the closed circuit, it is possible to apply the current of the same magnitude to the first and second testing coils 91 and 92, even if the characteristics of the resistance values or the like of the switching elements MS and S1 to S4 are different. Therefore, since the magnetic field of the same magnitude can be applied to the TMR elements 81 and 82, it is possible to determine whether the outputs of both the elements are balanced, for example, by using Equation 7 and Equation 8, that is, on the basis of the resistance values presented by the TMR elements 81 and 82.

Still further, according to the magnetic sensor 80 in the fourth embodiment, since the detection circuit 93 selects either the TMR element 81 or 82 and performs analog-digital conversion thereon, an inexpensive and small one-channel ADC can be employed for the ADC 93a, and it is possible to determine whether the selecting function of (the switching element 93b of) the detection circuit 93 is normal, thereby providing the magnetic sensor 80 that is highly reliable.

Figure 35:
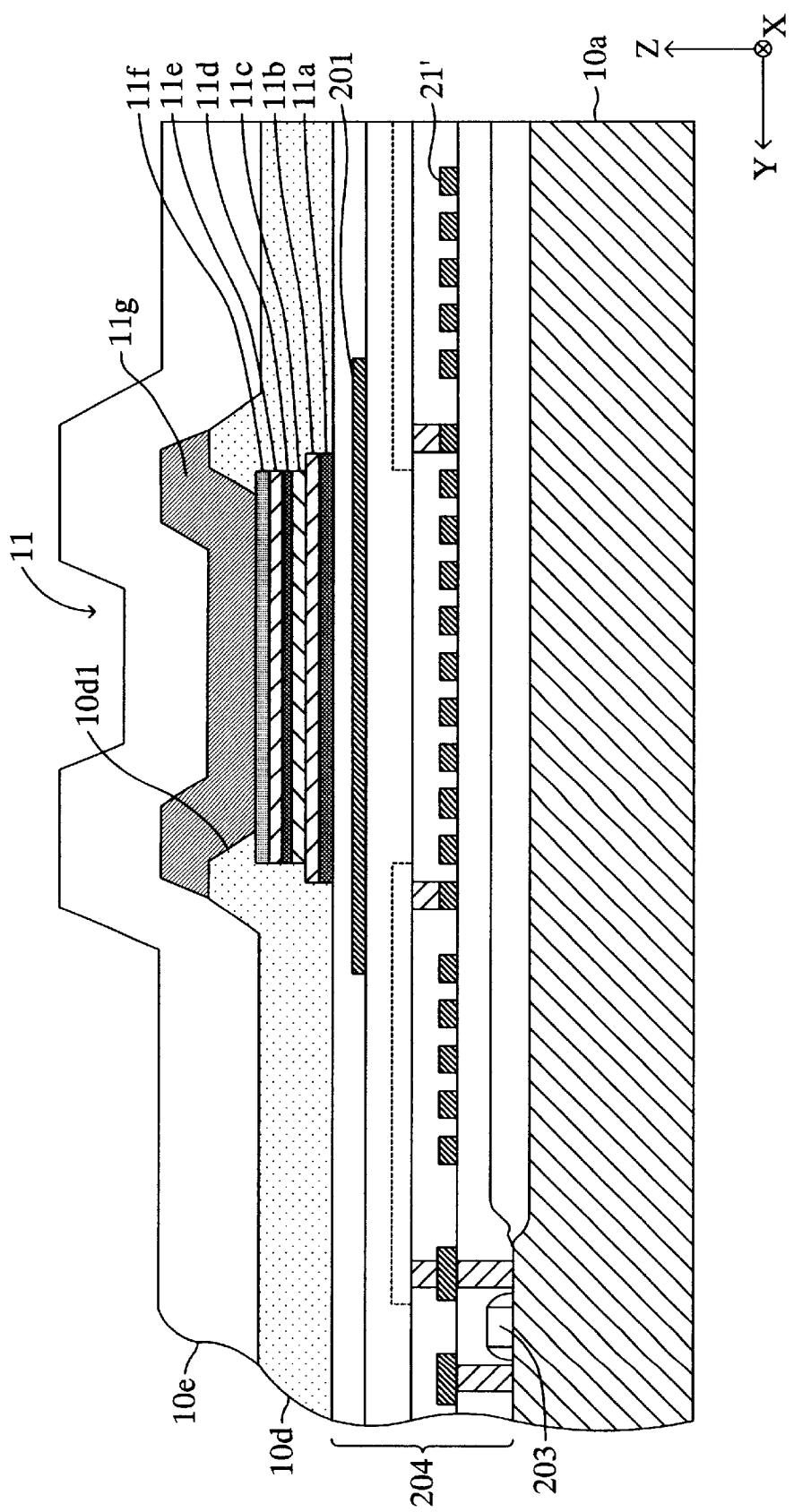
FIG. 35 is a sectional view of the part of the magnetic sensor taken along the line 4—4 of FIG. 34.
Figure 36:
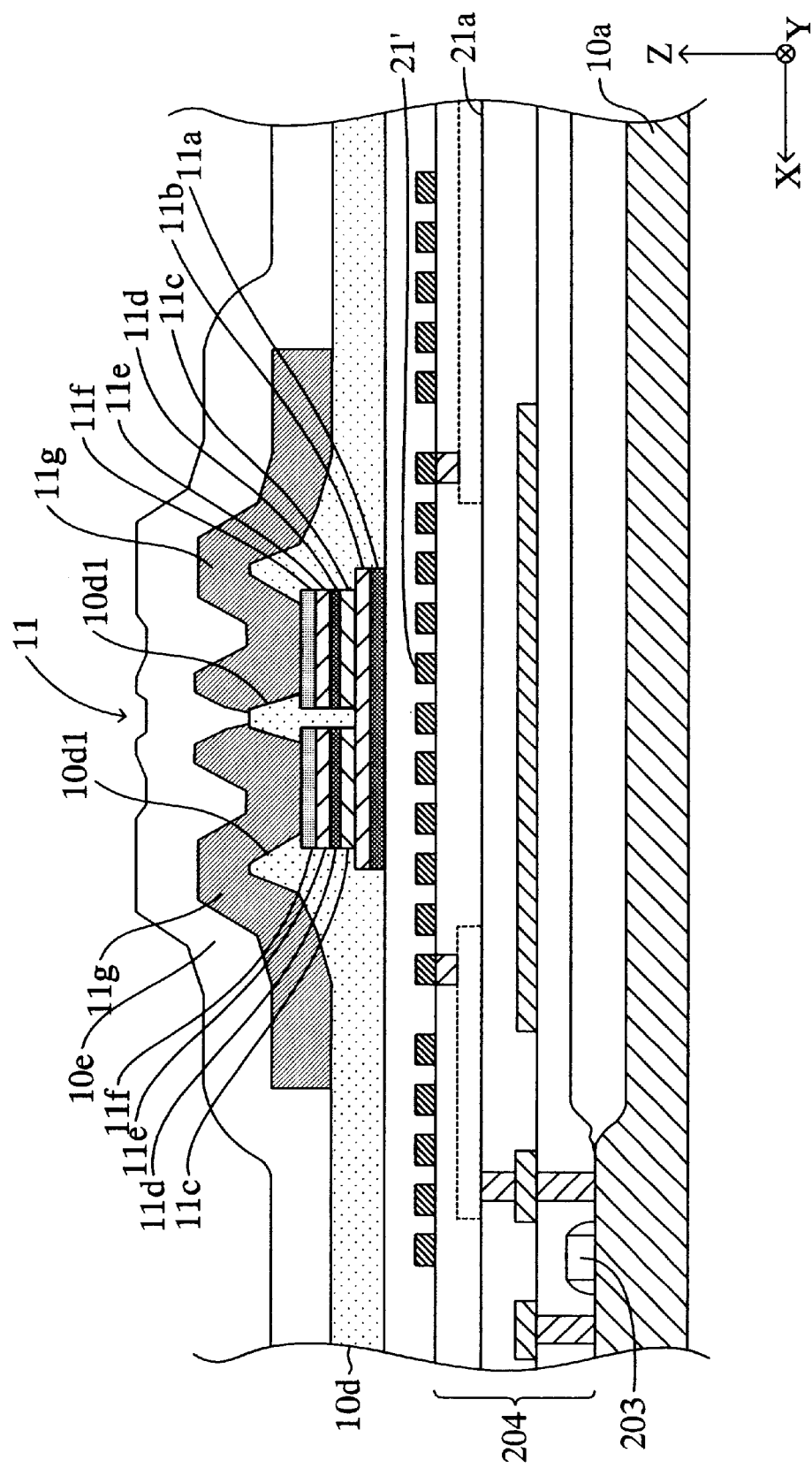
FIG. 36 is a sectional view of the part of the magnetic sensor taken along the line 5—5 of FIG. 34.

Yet further, as described above, since the magnetic sensor in each of the embodiments in accordance with the present invention employs the double spiral coil, the magnetic field required in each case can be generated, while the sensor being small and consuming lower electric power. The present invention is not limited to the above embodiments, and various modifications could be employed within the scope of the present invention. For example, if desired, two or more coils out of the initializing coil, the bias magnetic field coil and the test coil may be cumulated on and built in the substrate of each magnetic sensor, as shown in FIGS. 34 to 36.

Figure 34:
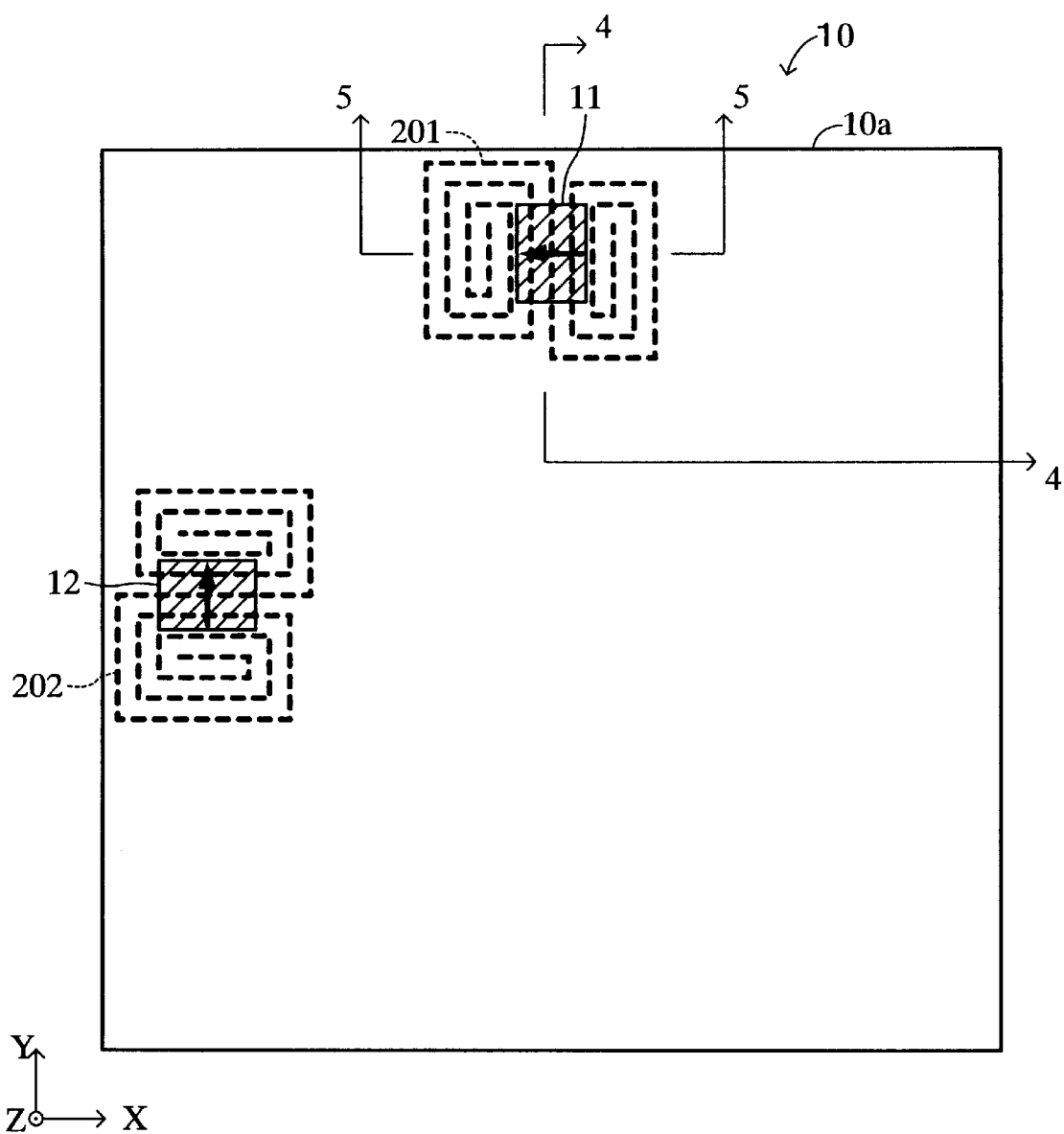
FIG. 34 is a schematic plan view of another embodiment of a magnetic sensor according to the present invention.

FIG. 34 is a schematic plan view of another embodiment of a magnetic sensor according to the present invention. FIG. 35 is a sectional view of the part of the magnetic sensor taken along the line 4—4 of FIG. 34. FIG. 36 is a sectional view of the part of the magnetic sensor taken along the line 5—5 of FIG. 34.

This magnetic sensor comprises TMR elements 11 and 12, initializing coils 201 and 202, the test coils 21' and 22', transistors 203 to control currents flowing through coils 11, 12, 21', and 22', and the like. The TMR elements 11 and 12, as well as the test coils 21' and 22' are the same as those described above.

The initializing coil 201 generates magnetic field for initializing a free layer included in the TMR element 11. The initializing coil 202 generates magnetic field for initializing a free layer included in the TMR element 12. The Initializing coils 201 and 202 are formed right under the TMR elements 11 and 21, respectively, and above the test coils 21' and 22', respectively, in the stacked insulating layer 204 over the substrate 10a. As described, the magnetic sensor according to the present invention may have both initializing coils and the test coils within a single chip.

Further, the magnetic sensor 60 in the third embodiment employs the GMR elements, however, it can also employ the TMR elements instead of the GMR elements. Additionally, the magnetic sensor 80 in the fourth embodiment employs the TMR elements 81 and 82, however, it may also employ other magnetoresistive effect elements such as the GMR elements instead of the TMR elements 81 and 82 as shown in FIG. 37, or may employ a magnetic detection unit in which these magnetoresistive effect elements are formed with being dispersedly arranged on the substrate and connected by the connection conductors in the form of a bridge circuit.

Figure 37:
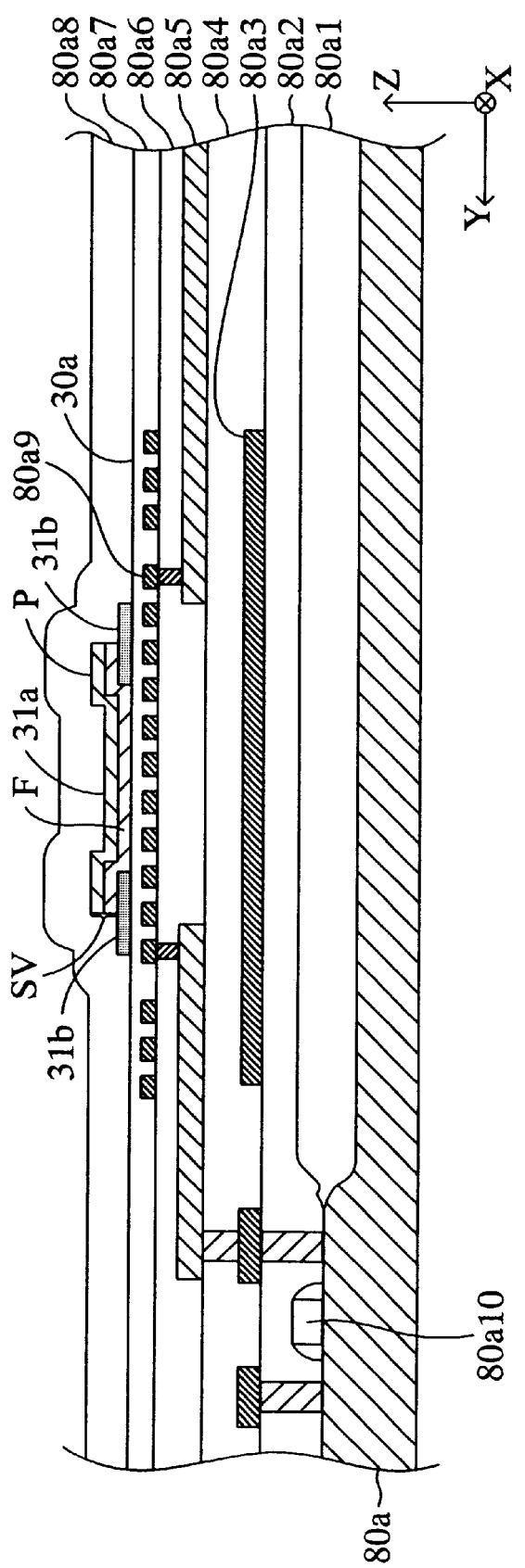
FIG. 37 shows a sectional view of a magnetic sensor using GMR elements according to the modification of the fourth embodiment.

It is noted that FIG. 37 shows a sectional view of a magnetic sensor using GMR elements according to the modification of the fourth embodiment described above. This sensor also includes both initializing coils and the test coils within a single chip. It is also noted that a field oxidization layer 80a1, a first insulating layer 80a2, a second insulating layer 80a4, a third insulating layer 80a6 and a first passivation layer 80a7 are layered (cwiulated) over the substrate 10a in order, and the second passivation layer is formed on the top of these layers and the GMR element including spin valve film SV and bias magnet films 31b. The test coils 80a3 corresponding to coils 91 and 92 shown in FIG. 20 are formed in the second insulating layer 80a4. The initializing coil 80a9 is formed in the first passivation layer 80a?. The transistor 80a10 is formed in the first Insulating layer 80a2.

In the above embodiments, the initializing coil, the bias magnetic field coil and the testing coil are formed on the single substrate (in the single chip) having the TMR elements or the GMR elements formed thereon However, these coils may be formed on a different (separate) substrate from the substrate on which these elements are formed, and the substrate carrying the elements thereon may come into intimate contact with the substrate carrying the coils thereon.

While the illustrative and presently preferred embodiments of the present invention have been described in detail herein, it is to be understood that the inventive concepts may be otherwise variously embodied and employed and that the appended claims are intended to be construed to include such variations except insofar as limited by the prior art.

What is claimed is:

1. A magnetic sensor comprising:
   a thin-film-like magnetoresistive effect element; and
   a coil formed in a plane parallel to a planar film surface of the magnetoresistive effect element, the coil generating magnetic fields applied to the magnetoresistive effect element:
   wherein the coil comprises a first conductor forming a spiral in a plan view, and a second conductor forming a spiral in the plan view;
   wherein the magnetoresistive effect element is disposed between a spiral center of the first conductor and a spiral center of the second conductor in the plan view; and
   wherein the first conductor and the second conductor are connected such that electric currents in substantially the same direction pass through a part of the first conductor at a portion overlapping the magnetoresistive effect element in a plan view and through a part of the second conductor at a portion overlapping the magnetoresistive effect element in the plan view.

2. The magnetic sensor according to claim 1. Wherein the part of the first conductor at the portion overlapping the magnetoresistive effect element the plan view and the part of the second conductor at the portion overlapping the magnetoresistive effect element in the plan view are formed rectilinearly parallel to each other.

3. The magnetic sensor according to claim 2, wherein widths of the first and second conductors at the portion overlapping the magnetoresistive effect element in the plan view are equal, the widths being different from widths of the first and second conductors at the remaining portions.

4. The magnetic sensor according to claim 1, wherein the coil generates a magnetic field for confirming whether the magnetoresistive effect element functions normally.

5. The magnetic sensor according to claim 1, wherein the magnetoresistive effect element is a magnetoresistive effect element including a free layer and a pin layer, and wherein the coil generates a magnetic field for initializing the direction of magnetization of the free layer.

6. The magnetic sensor according to claim 1, wherein the magnetoresistive effect element is a magnetic tunnel effect element, and wherein
   the coil generates a bias magnetic field for allowing the magnetic tunnel effect element to detect an external magnetic field applied to the element.

7. A magnetic sensor comprising:
   a substrate;
   a first magnetic detection portion formed on the substrate, the first magnetic detection portion indicating a physical quantity which becomes larger as the magnitude of a magnetic field in a first direction in a first orientation increases, the first magnetic detection portion indicating a the physical quantity which becomes smaller as the magnitude of a magnetic field in the opposite direction to the first direction in the first orientation increases;
   a second magnetic detection portion formed on the substrate, the second magnetic detection portion indicating a physical quantity which becomes larger as the magnitude of a magnetic field in a second direction in a second orientation that crosses the first orientation increases, the second magnetic detection portion indicating the physical quantity which becomes smaller as the magnitude of a magnetic field in the opposite direction to the second direction in the second orientation increases;
   a first testing coil disposed in the vicinity of the first magnetic detection portion, for generating a magnetic field whose magnitude and direction change in the first orientation depending on electric current flowing therethrough, to apply the generated magnetic field to the first magnetic detection portion:
   a second testing coil disposed in the vicinity of the second magnetic detection portion, for generating a magnetic field whose magnitude and direction change in the second orientation depending on electric current flowing therethrough, to apply the generated magnetic field to the second magnetic detection portion;
   an electric current supply source;
   a connection conductor for connecting the first testing coil and the second testing coil in series to the electric current supply source; and
   a conduction control circuit interposed in a closed circuit which comprises the electric current supply source, the first testing coil, the second testing coil and the connection conductor, for switching the states of the first testing coil and of the second testing coil into either a conductive state in which electric current from the electric current supply source flows therethrough or an unconductive state in which the electric current is shut off.

8. The magnetic sensor according to claim 7, further comprising:
   a detection circuit for selecting either the first magnetic detection portion or the second magnetic detection portion in response to an instruction signal from exterior, to detect a physical quantity indicated by the selected magnetic detection portion; and
   a control circuit for generating the instruction signal; wherein
   the first magnetic detection portion is configured so as to indicate the physical quantity of a first magnitude when the magnetic field of a predetermined magnitude is applied In the first direction in the first orientation, the first magnetic detection portion being configured so as to indicate the physical quantity of a second magnitude different from the first magnitude when the magnetic field of the predetermined magnitude is applied in the opposite direction to the first direction in the first orientation, wherein the second magnetic detection portion is configured so as to indicate the physical quantity of the first magnitude when the magnetic field of the predetermined magnitude is applied in the second direction in the second orientation, the second magnetic detection portion being configured so as to indicate the physical quantity of the second magnitude when the magnetic field of the predetermined magnitude is applied in the opposite direction to the second direction in the second orientation, and wherein when electric current of a predetermined magnitude flows in a predetermined direction through the first testing coil, the first testing coil applies a magnetic field of the predetermined magnitude in the first direction to the first magnetic detection portion and the second testing coil applies a magnetic field of the predetermined magnitude in the opposite direction to the second direction to the second magnetic detection portion, whereas when electric current of the predetermined magnitude flows in the opposite direction to the predetermined direction through the first testing coil, the first testing coil applies a magnetic field of the predetermined magnitude in the opposite direction to the first direction to the first magnetic detection portion and the second testing coil applies a magnetic field of the predetermined magnitude in the second direction to the second magnetic detection portion.

9. A magnetic sensor comprising:

a substrate:

a first magnetic detection portion formed on the substrate, the first magnetic detection portion indicating a physical quantity which becomes larger as the magnitude of a magnetic field in a first direction in a first orientation increases, the first magnetic detection portion indicating the physical quantity which becomes smaller as the magnitude of a magnetic field in the opposite direction to the first direction in the first orientation increases;

a second magnetic detection portion formed on the substrate, the second magnetic detection portion indicating a physical quantity which becomes larger as the magnitude of a magnetic field in a second direction in a second orientation that crosses the first orientation increases, the second magnetic detection portion indicating the physical quantity which becomes smaller as the magnitude of a magnetic field in the opposite direction to the second direction in the second orientation increases;

a first testing coil buried in the substrate and under the first magnetic detection portion, for generating a magnetic field whose magnitude and direction change in the first orientation depending on electric current flowing therethrough, to apply the generated magnetic field to the first magnetic detection portion;

a second testing coil buried in the substrate and under the second magnetic detection portion, for generating a magnetic field whose magnitude and direction change in the second orientation depending on electric current flowing therethrough, to apply the generated magnetic field to the second magnetic detection portion;

an electric current supply source;

a connection conductor for connecting the first testing coil and the second testing coil in series to the electric current supply source: and a conduction control circuit interposed in a closed circuit that comprises the electric current supply source, the first testing coil, the second testing coil and the connection conductor, for switching the states of the first testing coil and of the second testing coil into either a conductive state in which an electric current from the electric current supply source flows therethrough or an unconductive state in which the electric current is shut off.

10. The magnetic sensor according to claim 9, further comprising:

a detection circuit for selecting either the first magnetic detection portion or the second magnetic detection portion in response to an instruction signal from exterior, to detect a physical quantity indicated by the selected magnetic detection unit; and a control circuit for generating the instruction signal; wherein the first magnetic detection portion is configured so as to indicate the physical quantity of a first magnitude when the magnetic field of a predetermined magnitude is applied in the first direction in the first orientation, the first magnetic detection portion being configured so as to indicate the physical quantity of a second magnitude different from the first magnitude when the magnetic field of the predetermined magnitude is applied in the opposite direction to the first direction in the first orientation, wherein the second magnetic detection portion is configured so as to indicate the physical quantity of the first magnitude when the magnetic field of the predetermined magnitude is applied in the second direction in the second orientation, the second magnetic detection portion being configured so as to indicate the physical quantity of the second magnitude when the magnetic field of the predetermined magnitude is applied in the opposite direction to the second direction in the second orientation, and wherein when electric current of a predetermined magnitude flows in a predetermined direction through the first testing coil, the first testing coil applies a magnetic field of the predetermined magnitude in the first direction to the first magnetic detection portion and the second testing coil applies a magnetic field of the predetermined magnitude in the opposite direction to the second direction to the second magnetic detection portion, whereas when electric current of the predetermined magnitude flows in the opposite direction to the predetermined direction through the first testing coil, the first testing coil applies a magnetic field of the predetermined magnitude in the opposite direction to the first direction to the first magnetic detection portion and the second testing coil applies a magnetic field of the predetermined magnitude In the second direction to the second magnetic detection portion.

* * * * *